United States Patent
Kim

(10) Patent No.: US 11,996,159 B2
(45) Date of Patent: May 28, 2024

(54) SEMICONDUCTOR DEVICE INCLUDING CHARGE PUMP CIRCUIT TO GENERATE ON DEVICE HIGH VOLTAGES FOR MEMORY OPERATIONS

(71) Applicant: SK hynix Inc., Gyeonggi-do (KR)

(72) Inventor: Jong Seok Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 227 days.

(21) Appl. No.: 17/565,888

(22) Filed: Dec. 30, 2021

(65) Prior Publication Data

US 2023/0041842 A1 Feb. 9, 2023

(30) Foreign Application Priority Data

Aug. 4, 2021 (KR) .................. 10-2021-0102622

(51) Int. Cl.
*G11C 5/14* (2006.01)
(52) U.S. Cl.
CPC .................... *G11C 5/145* (2013.01)
(58) Field of Classification Search
CPC ........... G11C 5/145; G11C 7/02; H02M 3/073
See application file for complete search history.

(56) References Cited

U.S. PATENT DOCUMENTS

| 5,337,284 A | 8/1994 | Cordoba et al. |
| 2002/0036924 A1 | 3/2002 | Tanzawa |
| 2007/0170967 A1* | 7/2007 | Bae ............ H03K 5/15013 327/233 |
| 2007/0285151 A1 | 12/2007 | Fujiwara |
| 2012/0062291 A1* | 3/2012 | Saitoh ............ H04L 7/033 327/157 |
| 2017/0163146 A1 | 6/2017 | Suzuki et al. |

FOREIGN PATENT DOCUMENTS

| CN | 101087104 A | 12/2007 |
| CN | 101309079 A | 11/2008 |
| CN | 102195475 A | 9/2011 |
| CN | 106548804 A | 3/2017 |

(Continued)

OTHER PUBLICATIONS

English translation of KR-20060014795-A (Year: 2006).*

(Continued)

*Primary Examiner* — Ajay Ojha
(74) *Attorney, Agent, or Firm* — IP & T GROUP LLP

(57) ABSTRACT

A semiconductor device includes: a charge pump circuit configured to generate an output voltage by pumping an input voltage according to first and second main clocks, a voltage detection circuit configured to generate a comparison signal by comparing the output voltage with a reference voltage, and a driving control circuit configured to selectively invert first and second external clocks at a start time of an activation period of the comparison signal to receive the inverted clocks as first and second internal clocks, to generate the first and second main clocks according to the first and second internal clocks during the activation period while controlling a transition order so that the second main clock transitions after the first main clock transitions, and to store logic levels of the first and second main clocks, respectively, at an end time of the activation period.

19 Claims, 14 Drawing Sheets

(56) References Cited

FOREIGN PATENT DOCUMENTS

| KR | 10-2006-0014795 A | | 2/2006 |
|----|----|----|----|
| KR | 20060014795 A | * | 2/2006 |
| KR | 100813549 B1 | | 3/2008 |
| KR | 20090096871 A | | 9/2009 |
| KR | 10-2020-0144783 A | | 12/2020 |

OTHER PUBLICATIONS

Office Action for Korean Patent Application No. 10-2019-0072861 issued by the Korean Patent Office dated Jun. 7, 2023.
Office Action for the Chinese Patent Application No. 202010026843.4 issued by the Chinese Patent Office dated Dec. 4, 2023.
Notice of Allowance for the Korean Patent Application No. 10-2019-0072861 issued by the Korean Intellectual Property Office dated Dec. 1, 2023.

* cited by examiner

FIG. 7

| CK90_S | CK00_S | SEL<3:0> | CK90_SEL | CK00_SEL |
|--------|--------|----------|----------|----------|
| 0 | 0 | 0001 | CK90B | CK00B |
| 0 | 1 | 0010 | CK90B | CK00D |
| 1 | 0 | 0100 | CK90D | CK00B |
| 1 | 1 | 1000 | CK90D | CK00D |

FIG. 12

| | | | | | | OPERATION OF 638 | | OPERATION OF 634 | |
|---|---|---|---|---|---|---|---|---|---|
| CK90IN | CK00IN | CK90_S | CK00_S | SEL1<3:0> | SEL2<3:0> | CK90IN | CK00IN | CK90_SEL | CK00_SEL |
| 1 | 0 | 0 | 0 | 0001 | 1000 | CK90IN | CK00IN | CK90INB | CK00INB |
| 0 | 1 | 0 | 0 | 0001 | 0100 | CK90ED | CK00ED | CK90INB | CK00INB |
| 0 | 0 | 0 | 0 | 0001 | 0000 | CK90EB | CK00EB | CK90INB | CK00INB |
| 1 | 1 | 0 | 0 | 0001 | 1100 | CK90EB | CK00ED | CK90INB | CK00INB |
| 1 | 0 | 0 | 1 | 0010 | 1001 | CK90ED | CK00EB | CK90INB | CK00IN |
| 0 | 1 | 0 | 1 | 0010 | 0101 | CK90ED | CK00ED | CK90INB | CK00IN |
| 0 | 0 | 0 | 1 | 0010 | 0001 | CK90EB | CK00EB | CK90INB | CK00IN |
| 1 | 1 | 0 | 1 | 0010 | 1101 | CK90EB | CK00ED | CK90INB | CK00IN |
| 1 | 0 | 1 | 0 | 0100 | 1010 | CK90ED | CK00EB | CK90IN | CK00INB |
| 0 | 1 | 1 | 0 | 0100 | 0110 | CK90EB | CK00ED | CK90IN | CK00INB |
| 0 | 0 | 1 | 0 | 0100 | 0010 | CK90EB | CK00EB | CK90IN | CK00INB |
| 1 | 1 | 1 | 0 | 0100 | 1110 | CK90ED | CK00ED | CK90IN | CK00INB |
| 1 | 0 | 1 | 1 | 1000 | 1011 | CK90ED | CK00EB | CK90IN | CK00IN |
| 0 | 1 | 1 | 1 | 1000 | 0111 | CK90EB | CK00ED | CK90IN | CK00IN |
| 0 | 0 | 1 | 1 | 1000 | 0011 | CK90ED | CK00EB | CK90IN | CK00IN |
| 1 | 1 | 1 | 1 | 1000 | 1111 | CK90EB | CK00ED | CK90IN | CK00IN |

SEMICONDUCTOR DEVICE INCLUDING CHARGE PUMP CIRCUIT TO GENERATE ON DEVICE HIGH VOLTAGES FOR MEMORY OPERATIONS

CROSS-REFERENCE TO RELATED APPLICATION

This application claims priority under 35 U.S.C. § 119 to Korean Patent Application No. 10-2021-0102622 filed on Aug. 4, 2021, which is incorporated herein by reference in its entirety.

BACKGROUND

1. Field

Various embodiments of the present disclosure relate to a semiconductor design technology, and specifically, to a semiconductor device including a charge pump circuit.

2. Discussion of the Related Art

In the operation of nonvolatile memory devices, such as flash memory or electrically erasable programmable read-only memory (EEPROM) devices, or volatile memory devices such as dynamic random access memory (DRAM) devices, high voltages are required for program and erase operations. These high voltages can be internally generated at a higher level than an external supply voltage. A charge pump circuit can be used to generate such high voltages.

In various fields at present, charge pump circuits are being developed to improve voltage multiplier efficiency and power efficiency.

SUMMARY

Various embodiments of the present disclosure are directed to a semiconductor device capable of reducing an input current consumed by clocks provided to a charge pump circuit.

In accordance with an embodiment of the present disclosure, a semiconductor device includes: a charge pump circuit suitable for generating an output voltage by pumping an input voltage according to first and second main clocks; a voltage detection circuit suitable for generating a comparison signal by comparing the output voltage with a reference voltage; and a driving control circuit suitable for generating the first and second main clocks according to first and second external clocks during an activation time period of the comparison signal while controlling a transition sequence such that the second main clock transitions after the first main clock transitions.

In accordance with an embodiment of the present disclosure, an operating method of a semiconductor device includes: generating an output voltage by pumping an input voltage according to first and second main clocks; comparing the output voltage with a reference voltage to generate and output a comparison signal; generating an output enable signal by determining whether a transition sequence of first and second external clocks meets a condition based on logic levels of first and second preliminary clocks during an activation time period of the comparison signal; outputting the first and second main clocks by latching the first and second external clocks according to the output enable signal; and storing the first and second main clocks as the first and second preliminary clocks, respectively, at an end of the activation time period of the comparison signal.

In accordance with an embodiment of the present disclosure, an operating method of a semiconductor device includes: generating first and second main clocks by respectively latching first and second external clocks according to an output enable signal; generating an output voltage by pumping an input voltage according to the first and second main clocks; generating a comparison signal by comparing the output voltage with a reference voltage; and generating the output enable signal by determining whether a transition sequence of first and second external clocks meets a condition during an activation time period of the comparison signal.

In accordance with an embodiment of the present disclosure, a semiconductor device may include: a charge pump circuit configured to generate an output voltage by pumping an input voltage according to first and second main clocks; a voltage detection circuit configured to generate a comparison signal by comparing the output voltage with a reference voltage; and a driving control circuit configured to: selectively invert first and second external clocks at a start time of an activation period of the comparison signal to generate as first and second internal clocks, generate the first and second main clocks according to the first and second internal clocks during the activation period of the comparison signal while controlling a transition order so that the second main clock transitions after the first main clock transitions, and store logic levels of the first and second main clocks as first and second preliminary clocks, respectively, at an end time of an activation period of the comparison signal.

In accordance with an embodiment of the present disclosure, a method of operating a semiconductor device, the method may include: generating an output voltage by pumping an input voltage according to first and second main clocks; generating a comparison signal by comparing the output voltage with a reference voltage; selectively inverting, at a start time of an activation period of the comparison signal, first and second external clocks to generate as first and second internal clocks; generating, during an activation period of the comparison signal, an output activation signal by determining whether the second internal clock transitions after the first internal clock transitions on the basis of logic levels of first and second preliminary clocks; outputting the first and second main clocks by latching the first and second internal clocks according to the output activation signal; and storing, at an end time point of the activation period of the comparison signal, the first and second main clocks as the first and second preliminary clocks, respectively.

In accordance with an embodiment of the present disclosure, an operating method of a semiconductor device, the operating method may include: generating an output voltage by pumping an input voltage according to first and second main clocks; generating a comparison signal by comparing the output voltage with a reference voltage; generating first and second internal clocks by selectively inverting, at a timepoint when the comparison signal becomes enabled, first and second external clocks according to respective logic levels of the first and second internal clocks and first and second detection signals; and generating, while the comparison signal stays enabled, the first and main clocks from the first and second internal clocks according to respective logic levels of the first and second internal clocks and first and second detection signals. The first and second detection signals may represent, while the comparison signal stays enabled, respective logic levels of the first and second main clocks at a timepoint when the comparison signal becomes disabled. The first and second main clocks may toggle at different timings from each other.

A semiconductor device in accordance with an embodiment of the present disclosure has an effect capable of reducing an input current of a charge pump circuit and reducing overall power, thereby improving power efficiency.

Furthermore, a semiconductor device in accordance with an embodiment of the present disclosure has an effect capable of minimizing the time required for an operation of a charge pump circuit and reducing the ripple (noise) of a pumping voltage level, thereby improving power efficiency.

BRIEF DESCRIPTION OF THE DRAWINGS

FIG. 7 is a table describing an operation of a driving control circuit, such as that shown in FIG. 6, in accordance with an embodiment of the present disclosure.

FIG. 12 is a table for describing an operation of the driving control circuit in FIG. 10 in accordance with an embodiment of the present disclosure.

DETAILED DESCRIPTION

Figure 1:
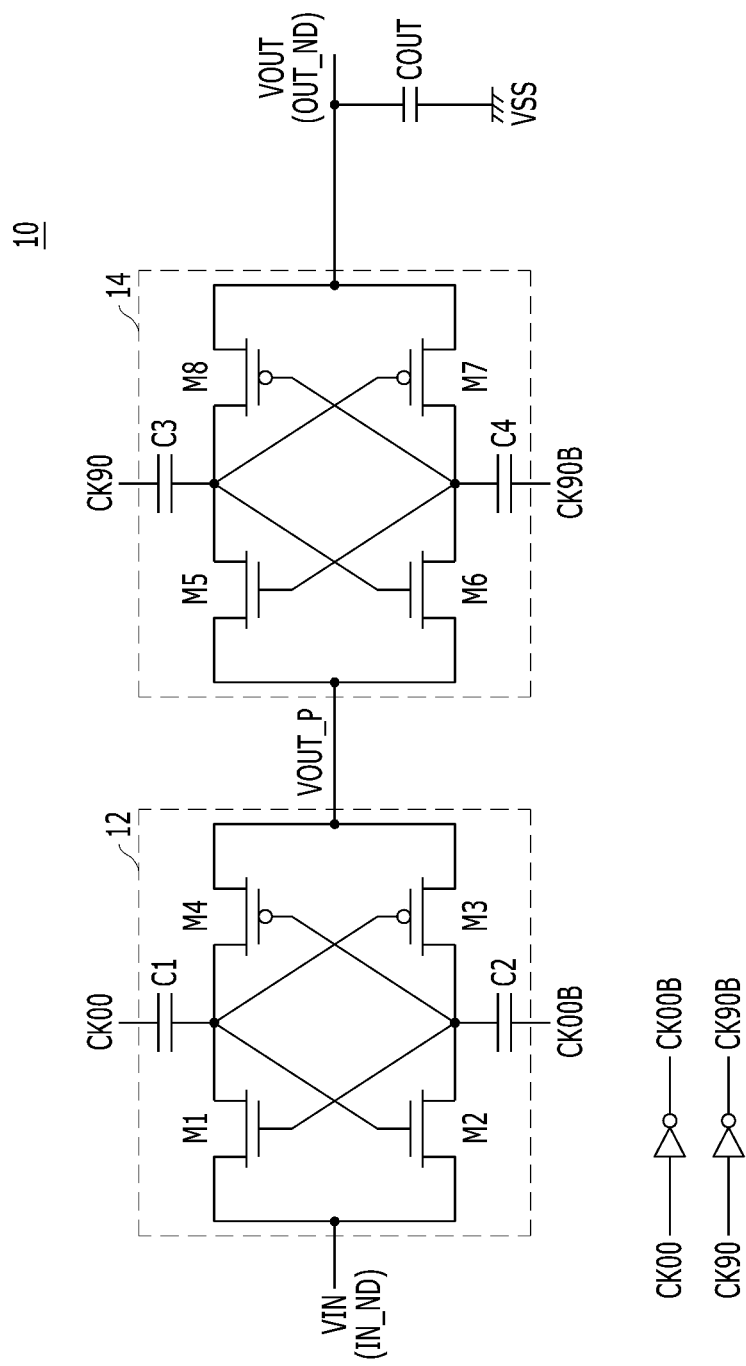
FIG. 1 is a circuit diagram illustrating a charge pump circuit of a cross-coupled type in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Hereinafter, various embodiments of the present disclosure are described in detail with reference to the attached drawings.

FIG. 1 is a circuit diagram illustrating a charge pump circuit 10 of a cross-coupled type in accordance with an embodiment of the present disclosure.

Referring to FIG. 1, the charge pump circuit 10 may include a first pump circuit 12, a second pump circuit 14 and an output capacitor COUT.

Though FIG. 1 shows the charge pump circuit 10 in which two pump stages, i.e., the first and second pump circuits 12 and 14, are coupled in series, the present invention is not limited thereto. In an embodiment, the second pump circuit 14 may be configured to be coupled to a switch (not shown) in parallel. When the switch is turned on, a first output voltage VOUT_P from the first pump circuit 12 is directly provided to an output terminal OUT_ND. In another embodiment, the charge pump circuit 10 may include two or more pump stages coupled in series. In this case, the charge pump circuit 10 may additionally include one or more switches (not shown), each of which is coupled to a corresponding pump stage in parallel. By controlling turn on of the switches according to load capacitance of an output terminal, a level of an output voltage may be adjusted. As a result, the charge pump circuit 10 can be used universally by adjusting the level of the output voltage applied to the output terminal OUT_ND.

The first and second pump circuits 12 and 14 may operate according to a pair of complementary clocks, each having an opposite phase. For example, a pair of first complementary clocks may include a first main clock CK00 and a first sub clock CK00B, and a pair of second complementary clocks may include a second main clock CK90 and a second sub clock CK90B. The first pump circuit 12 may generate the first output voltage VOUT_P by pumping an input voltage VIN at an input terminal IN_ND according to the first main clock CK00 and the first sub clock CK00B. The first main clock CK00 may have an opposite phase to the first sub clock CK00B, and the same period as the first sub clock CK00B. For example, when the first main clock CK00 has a logic high level, the first sub clock CK00B has a logic low level. When the first main clock CK00 has a logic low level, the first sub clock CK00B has a logic high level. The first sub clock CK00B may be generated by inverting the first main clock CK00.

The second pump circuit 14 may generate a second output voltage VOUT at the output terminal OUT_ND by pumping the first output voltage VOUT_P according to the second main clock CK90 and the second sub clock CK90B. The second main clock CK90 may have an opposite phase to the second sub clock CK09B, and the same period as the second sub clock CK09B. For example, when the second main clock CK90 has a logic high level, the second sub clock CK90B has a logic low level. When the second main clock CK90 has a logic low level, the second sub clock CK90B has a logic high level. The second sub clock CK90B may be generated by inverting the second main clock CK90. Preferably, the first main clock CK00 and the second main clock CK90 have a phase difference of 90 degrees, and the first sub clock CK00B and the second sub clock CK90B have a phase difference of 90 degrees.

The output capacitor COUT may be coupled between the output terminal OUT_ND and a ground voltage (VSS) terminal.

The first pump circuit 12 may include first to fourth transistors M1 to M4 and first and second capacitors C1 and C2. The second pump circuit 14 may include fifth to eighth transistors M5 to M8 and third and fourth capacitors C3 and C4. The first capacitor C1 may have a first terminal receiving the first main clock CK00, the second capacitor C2 may have a first terminal receiving the first sub clock CK00B, the third capacitor C3 may have a first terminal receiving the second main clock CK90, and the fourth capacitor C4 may have a first terminal receiving the second sub clock CK90B.

Since the second pump circuit 14 has substantially the same configuration as the first pump circuit 12, the first pump circuit 12 is described as an example.

The first transistor M1 may be coupled between the input terminal IN_ND and a second terminal of the first capacitor C1, and have a gate receiving the first sub clock CK00B transferred through the second capacitor C2. The second transistor M2 may be coupled between the input terminal IN_ND and a second terminal of the second capacitor C2, and have a gate receiving the first main clock CK00 transferred through the first capacitor C1. The third transistor M3 may be coupled between the second terminal of the second capacitor C2 and an output node at which the first output voltage VOUT_P is outputted, and have a gate receiving the first main clock CK00 transferred through the first capacitor C1. The fourth transistor M4 may be coupled between the second terminal of the first capacitor C1 and the output node, and have a gate receiving the first sub clock CK00B transferred through the second capacitor C2. Preferably, the first and second transistors M1 and M2 may be implemented with an N-channel metal oxide semiconductor (NMOS) transistor, and the third and fourth transistors M3 and M4 may be implemented with a P-channel metal oxide semiconductor (PMOS) transistor.

When the charge pump circuit 10 includes two or more pump stages coupled in series, odd-numbered pump stages in the series may be driven according to the first main clock CK00 and the first sub clock CK00B, whereas the even-numbered pump stages in the series may be driven according to the second main clock CK90 and the second sub clock CK90B.

Figure 2:
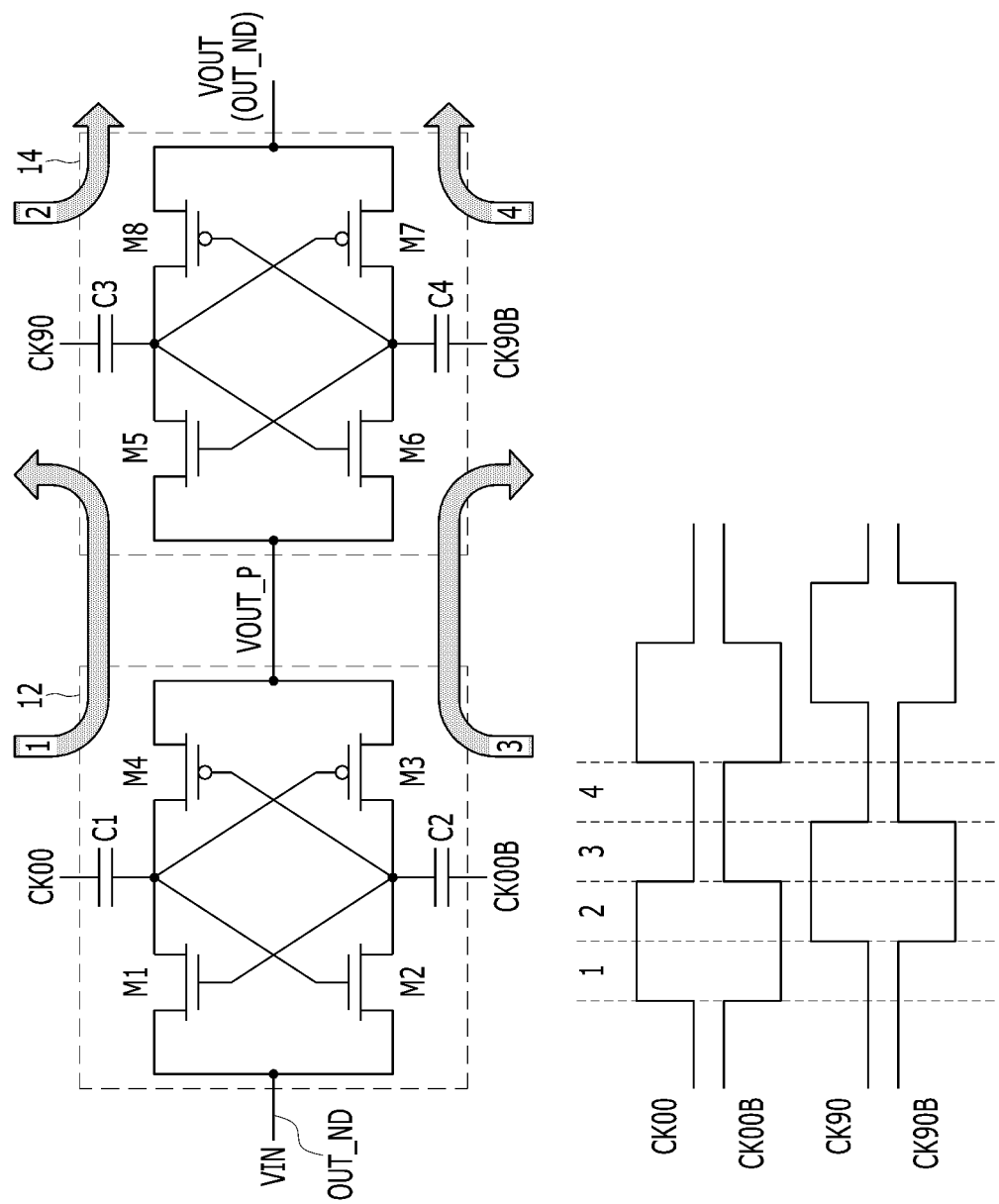
FIG. 2 is a timing diagram describing an operation of a charge pump circuit, such as that shown in FIG. 1 in accordance with an embodiment of the present disclosure.

FIG. 2 is a timing diagram describing an operation of the charge pump circuit 10 shown in FIG. 1 in accordance with an embodiment of the present disclosure.

Referring to FIG. 2, operations of the first pump circuit 12 and the second pump circuit 14 are described.

[A First Section]

During the first section or first time period, the first main clock CK00 becomes a logic high level, and the first sub clock CK00B becomes a logic low level. The first transistor M1 and the third transistor M3 are turned off, and the second transistor M2 and the fourth transistor M4 are turned on. The second main clock CK90 becomes a logic low level, and the second sub clock CK90B becomes a logic high level. The fifth transistor M5 and the seventh transistor M7 are turned on, and the sixth transistor M6 and the eighth transistor M8 are turned off.

As a result, a voltage charged at the first capacitor C1 is discharged and provided to the second pump circuit 14 as the first output voltage VOUT_P. The first output voltage VOUT_P provided to the second pump circuit 14 is charged at the third capacitor C3 through the fifth transistor M5. At this time, the input voltage VIN at the input terminal IN_ND is charged at the second capacitor C2 through the second transistor M2, and a voltage charged at the fourth capacitor C1 is discharged and outputted to the output terminal OUT_ND as the second output voltage VOUT.

[A Second Section]

During the second section or second time period, in a state that the first main clock CK00 and the first sub clock CK00B maintain the same phases as those of the first section, the second main clock CK90 transitions to a logic high level, and the second sub clock CK90B transitions to a logic low level. The fifth transistor M5 and the seventh transistor M7 are turned off, and the sixth transistor M6 and the eighth transistor M8 are turned on. As a result, a voltage charged at the third capacitor C3 is discharged and provided to the output terminal OUT_ND as the second output voltage VOUT. At this time, the first output voltage VOUT_P is charged at the fourth capacitor C4 through the sixth transistor M6.

[A Third Section]

During the third section or third time period, in a state that the second main clock CK90 and the second sub clock CK90B maintain the same phases as those of the second section, the first main clock CK00 transitions to a logic low level, and the first sub clock CK00B transitions to a logic high level. The first transistor M1 and the third transistor M3 are turned on. A voltage charged at the second capacitor C2 is discharged and provided to the second pump circuit 14 as the first output voltage VOUT_P. Since the sixth transistor M6 is turned on, the first output voltage VOUT_P is charged at the fourth capacitor C4 through the sixth transistor M6. At this time, the input voltage VIN at the input terminal IN_ND is charged at the first capacitor C1 through the first transistor M1.

[A Fourth Section]

During the fourth section or fourth time period, in a state that the first main clock CK00 and the first sub clock CK00B maintain the same phases as those of the third section, the second main clock CK90 transitions to a logic low level, and the second sub clock CK90B transitions to a logic high level. The fifth transistor M5 and the seventh transistor M7 are turned on, and the sixth transistor M6 and the eighth transistor M8 are turned off. A voltage charged at the fourth capacitor C4 is discharged and provided to the output terminal OUT_ND as the second output voltage VOUT. At this time, the first output voltage VOUT_P is charged at the third capacitor C3 through the fifth transistor M5.

As described above, as the first and second main clocks CK00 and CK90 and the first and second sub clocks CK00B and CK90B are toggling, the operations for the first to fourth sections are repeatedly performed. As a result, the second output voltage VOUT at the output terminal OUT_ND is charged at the output capacitor (COUT of FIG. 1), thereby being outputted as a final output voltage.

Figure 3:
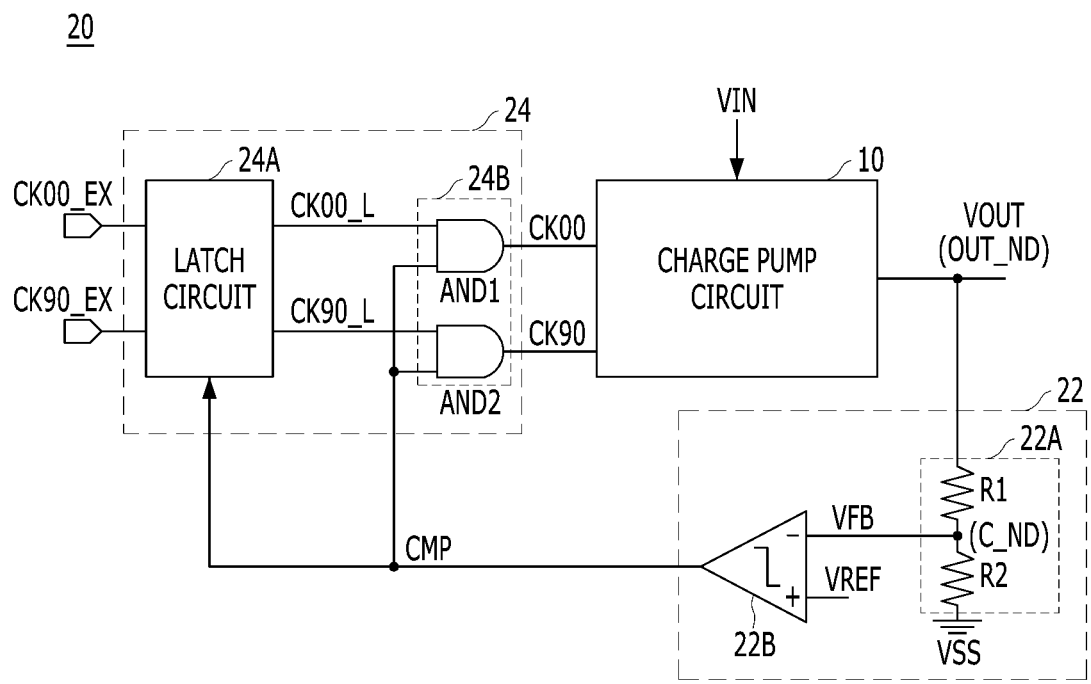
FIG. 3 is a block diagram illustrating a semiconductor device to which a charge pump circuit, such as that shown in FIG. 1, is embedded, in accordance with an embodiment of the present disclosure.

FIG. 3 is a block diagram illustrating a semiconductor device 20 to which the charge pump circuit 10 shown in FIG. 1 is embedded in accordance with an embodiment of the present disclosure.

Referring to FIG. 3, the semiconductor device 20 may include the charge pump circuit 10, a voltage detection circuit 22, and a driving control circuit 24.

The charge pump circuit 10 may have substantially the same structure and operation as those of FIGS. 1 and 2.

The voltage detection circuit 22 may generate a comparison signal CMP by comparing an output voltage VOUT with a reference voltage VREF. The voltage detection circuit 22 may include a divider 22A and a comparator 22B.

The divider 22A may divide the output voltage VOUT according to a set ratio to output a detection voltage VFB. The divider 22A may include first and second resistors R1 and R2 coupled in series between an output terminal OUT_ND and a ground voltage (VSS) terminal. The divider 22A may output the detection voltage VFB at a common terminal C_ND between the first and second resistors R1 and R2. The comparator 22B may output the comparison signal CMP by comparing the detection voltage VFB with the reference voltage VREF. The comparator 22B may activate the comparison signal CMP to a high level when the detection voltage VFB is lower than the reference voltage VREF. Preferably, a band-gap voltage with a constant voltage level regardless of changes in an external supply voltage may be used as the reference voltage VREF.

The driving control circuit 24 may latch first and second external clocks CK00_EX and CK90_EX according to the comparison signal CMP to output first and second main clocks CK00 and CK90. The driving control circuit 24 may include a latch circuit 24A and an output circuit 24B.

The latch circuit 24A may detect each rising edge of the first and second external clocks CK00_EX and CK90_EX during an activation section or activation time period of the comparison signal CMP, and output first and second intermediate clocks CK00_L and CK90_L. The first and second intermediate clocks CK00_L and CK90_L may have substantially the same activation section as the first and second external clocks CK00_EX and CK90_EX, respectively. The output circuit 24B may output the first and second intermediate clocks CK00_L and CK90_L as the first and second main clocks CK00 and CK90, respectively, during the activation section of the comparison signal CMP. The output circuit 24B may include a first logic gate AND1 and a second logic gate AND2. The first logic gate AND1 may perform a logic AND operation on the first intermediate clock CK00_L and the comparison signal CMP to output the first main clock CK00. The second logic gate AND2 may perform a logic AND operation on the second intermediate clock CK90_L and the comparison signal CMP to output the second main clock CK90.

Figure 4A:
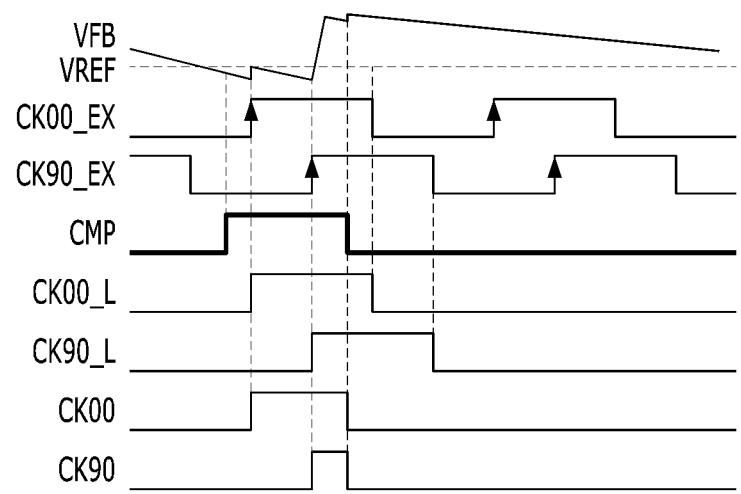
FIGS. 4A and 4B are timing diagrams describing an operation of a semiconductor device, such as that shown in FIG. 3, in accordance with an embodiment of the present disclosure.
Figure 4B:
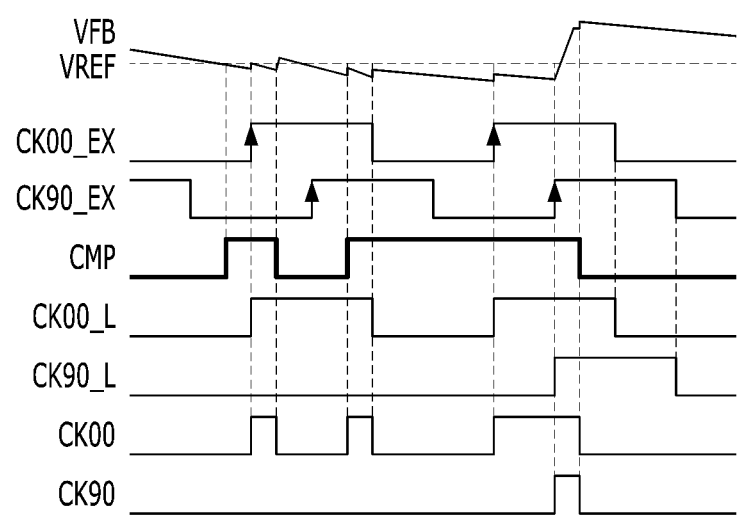

FIGS. 4A and 4B are timing diagrams describing an operation of the semiconductor device 20 shown in FIG. 3 in accordance with an embodiment of the present disclosure.

Referring to FIGS. 4A and 4B, the voltage detection circuit 22 may generate the comparison signal CMP by comparing the output voltage VOUT with the reference voltage VREF. The voltage detection circuit 22 may activate the comparison signal CMP to a high level when the detection voltage VFB is lower than the reference voltage VREF. The latch circuit 24A may detect each rising edge of the first and second external clocks CK00_EX and CK90_EX during the activation section of the comparison signal CMP, and output the first and second intermediate clocks CK00_L and CK90_L. The output circuit 24B may output the first and second intermediate clocks CK00_L and CK90_L as the first and second main clocks CK00 and CK90, respectively, during the activation section of the comparison signal CMP. That is, during the activation section of the comparison signal CMP, the driving control circuit 24 may activate the first and second main clocks CK00 and CK90 for a certain period by detecting each rising edge of the first and second external clocks CK00_EX and CK90_EX, and deactivate the first and second main clocks CK00 and CK90 at an end of the activation section or time period of the comparison signal CMP.

In a case shown in FIG. 4A, the first and second main clocks CK00 and CK90 may simultaneously transition at the end of the activation section/time period of the comparison signal CMP, i.e., a falling edge of the comparison signal CMP. Since switching operations of the clocks are simultaneously performed, a peak current consumed due to the switching operations may increase. In a case shown in FIG. 4B, only the first main clock CK00 toggles during the activation section of the comparison signal CMP. The second main clock CK90 does not toggle during that time. Since the second main clock CK90 does not toggle even if the first main clock CK00 toggles, the operations for the first to fourth sections described in FIG. 2 may not be repeatedly performed. Thus, the charge pump circuit 10 does not pump an input voltage VIN. Even when the first main clock CK00 is toggling, the output voltage VOUT is not generated, which increases a current consumption due to unnecessary switching operations.

Hereinafter, a semiconductor device including a charge pump circuit, capable of minimizing/reducing current consumption due to input clocks of the charge pump circuit, is described in detail.

Figure 5:
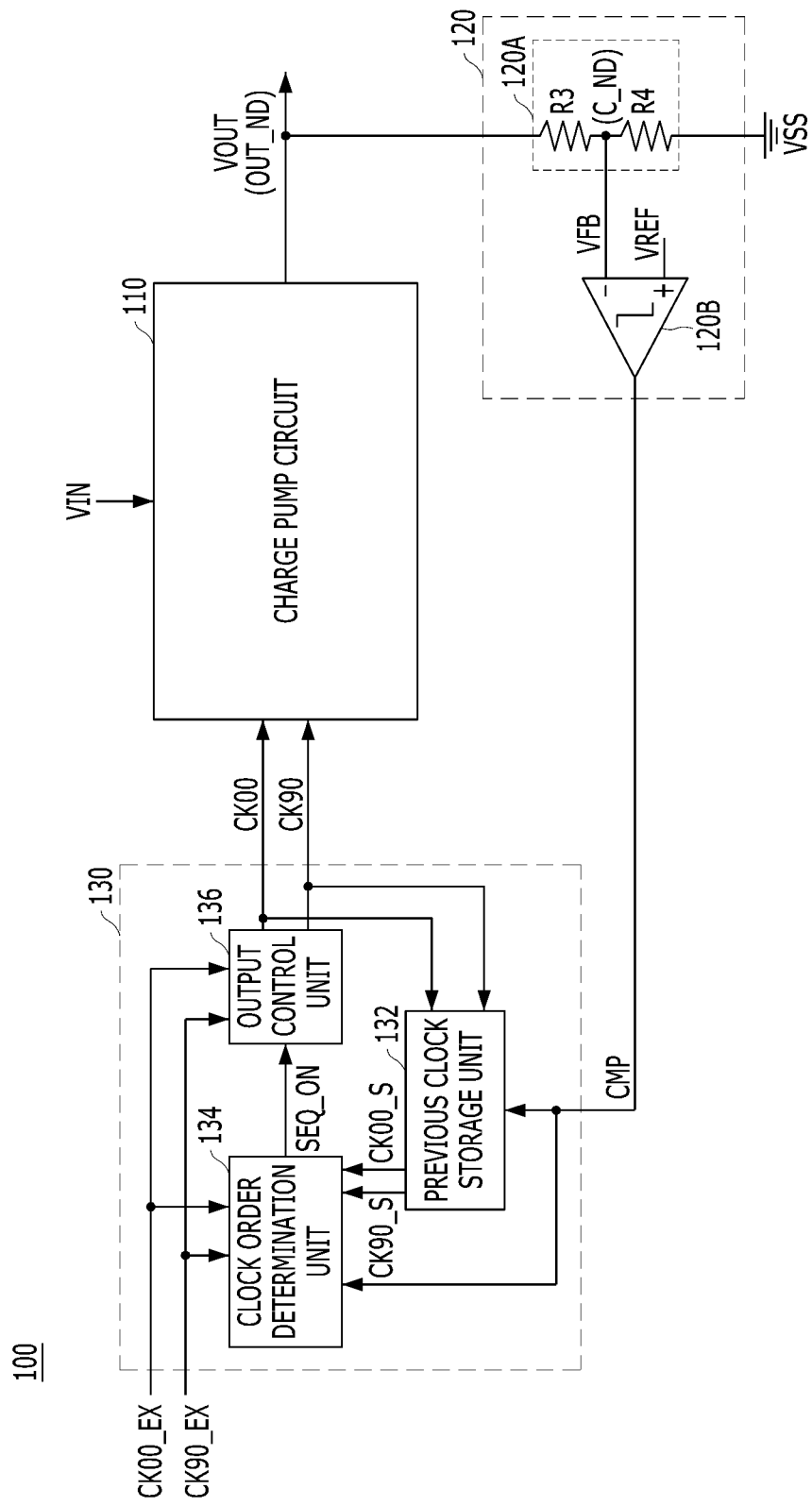
FIG. 5 is a block diagram illustrating a semiconductor device to which a charge pump circuit is embedded, in accordance with an embodiment of the present disclosure.

FIG. 5 is a block diagram illustrating a semiconductor device 100 to which a charge pump circuit is embedded, in accordance with an embodiment of the present disclosure.

Referring to FIG. 5, the semiconductor device 100 may include a charge pump circuit 110, a voltage detection circuit 120, and a driving control circuit 130.

The charge pump circuit 110 may generate an output voltage VOUT by pumping an input voltage VIN according to a first main clock CK00 and a second main clock CK90. The charge pump circuit 110 may perform a pumping operation on the input voltage VIN to increase a level of the output voltage VOUT according to the first main clock CK00 and the second main clock CK90. The charge pump circuit 110 may have substantially the same structure and operation of the charge pump circuit 10 as those of FIGS. 1 and 2.

The voltage detection circuit 120 may generate a comparison signal CMP by comparing the output voltage VOUT with a reference voltage VREF. The voltage detection circuit 120 may include a divider 122 and a comparator 124.

The divider 122 may divide the output voltage VOUT according to a set ratio to output a detection voltage VFB. The divider 122 may include first and second resistors R3 and R4 coupled in series between an output terminal OUT_ND and a ground voltage (VSS) terminal. The divider 122 may output the detection voltage VFB at a common terminal C_ND between the first and second resistors R3 and R4. The comparator 124 may output the comparison signal CMP by comparing the detection voltage VFB with the reference voltage VREF. The comparator 124 may activate the comparison signal CMP to a high level when the detection voltage VFB is lower than the reference voltage VREF. Preferably, a band-gap voltage with a constant voltage level regardless of changes in an external supply voltage may be used as the reference voltage VREF.

The driving control circuit 130 may generate first and second main clocks CK00 and CK90 according to first and second external clocks CK00_EX and CK90_EX during an activation section of the comparison signal CMP. In particular, the driving control circuit 130 in accordance with an embodiment may control the first and second main clocks CK00 and CK90 to transition according to a transition sequence. The driving control circuit 130 may control the transition sequence such that the second main clock CK90 transitions after the first main clock CK00 transitions. During the activation section of the comparison signal CMP, the driving control circuit 130 may control the second main clock CK90 to transition to a logic high level from a logic low level after the first main clock CK00 transitions to a logic high level from a logic low level. During the activation section of the comparison signal CMP, the driving control circuit 130 may control the second main clock CK90 to transition to a logic low level from a logic high level after the first main clock CK00 transitions to a logic low level from a logic high level. Further, the driving control circuit 130 in accordance with an embodiment may control the first and second main clocks CK00 and CK90 to maintain their logic levels at an end of the activation section/time period of the comparison signal CMP.

In detail, the driving control circuit 130 may include a previous clock storing circuit 132, a sequence determination circuit 134 and an output control circuit 136.

The previous clock storing circuit 132 may store the first and second main clocks CK00 and CK90 as first and second preliminary clocks CK00_S and CK90_S, respectively, according to the comparison signal CMP. The previous clock storing circuit 132 may store the first and second main clocks CK00 and CK90 at the end of the activation section/time period of the comparison signal CMP, i.e., in synchronization with a falling edge of the comparison signal CMP.

The sequence determination circuit 134 may generate an output enable signal SEQ_ON by determining whether a transition sequence of the first and second external clocks CK00_EX and CK90_EX meets a certain condition, based on the first and second preliminary clocks CK00_S and CK90_S, during the activation section of the comparison signal CMP. The certain condition may be that the second external clock CK90_EX transitions to a logic high level from a logic low level after the first external clock CK00_EX transitions to a logic high level from a logic low level, or, alternatively, that the second external clock CK90_EX transitions to a logic low level from a logic high level after the first external clock CK00_EX transitions to a logic low level from a logic high level. In detail, the sequence determination circuit 134 may generate a selection signal (SEL<3:0> of FIG. 6) by decoding logic levels of the first and second preliminary clocks CK00_S and CK90_S. The sequence determination circuit 134 may select one of the first external clock CK00_EX and an inverted signal (not shown) of the first external clock CK00_EX, and output a first sequence selection signal (CK00_SEL of FIG. 6), according to the selection signal SEL<3:0>. The sequence determination circuit 134 may select one of the second external clock CK90_EX and an inverted signal (not shown) of the second external clock CK90_EX, and output a second sequence selection signal (CK90_SEL of FIG. 6), according to the selection signal SEL<3:0>. The sequence determination circuit 134 may generate the output enable signal SEQ_ON according to the comparison signal CMP, the first sequence selection signal CK00_SEL and the second sequence selection signal CK90_SEL.

The output control circuit 136 may output the first and second main clocks CK00 and CK90 by latching the first and second external clocks CK00_EX and CK90_EX according to the output enable signal SEQ_ON.

As described above, the driving control circuit 130 in accordance with an embodiment may control a transition sequence such that the second main clock CK90 transitions after the first main clock CK00 transitions. Further, the driving control circuit 130 in accordance with an embodiment may control the first and second main clocks CK00 and CK90 to maintain their logic levels at the end of the activation section/time period of the comparison signal CMP. Accordingly, the semiconductor device 100 can control the first and second main clocks CK00 and CK90 not to simultaneously transition, and can minimize/reduce current consumption due to unnecessary switching operations.

Figure 6:
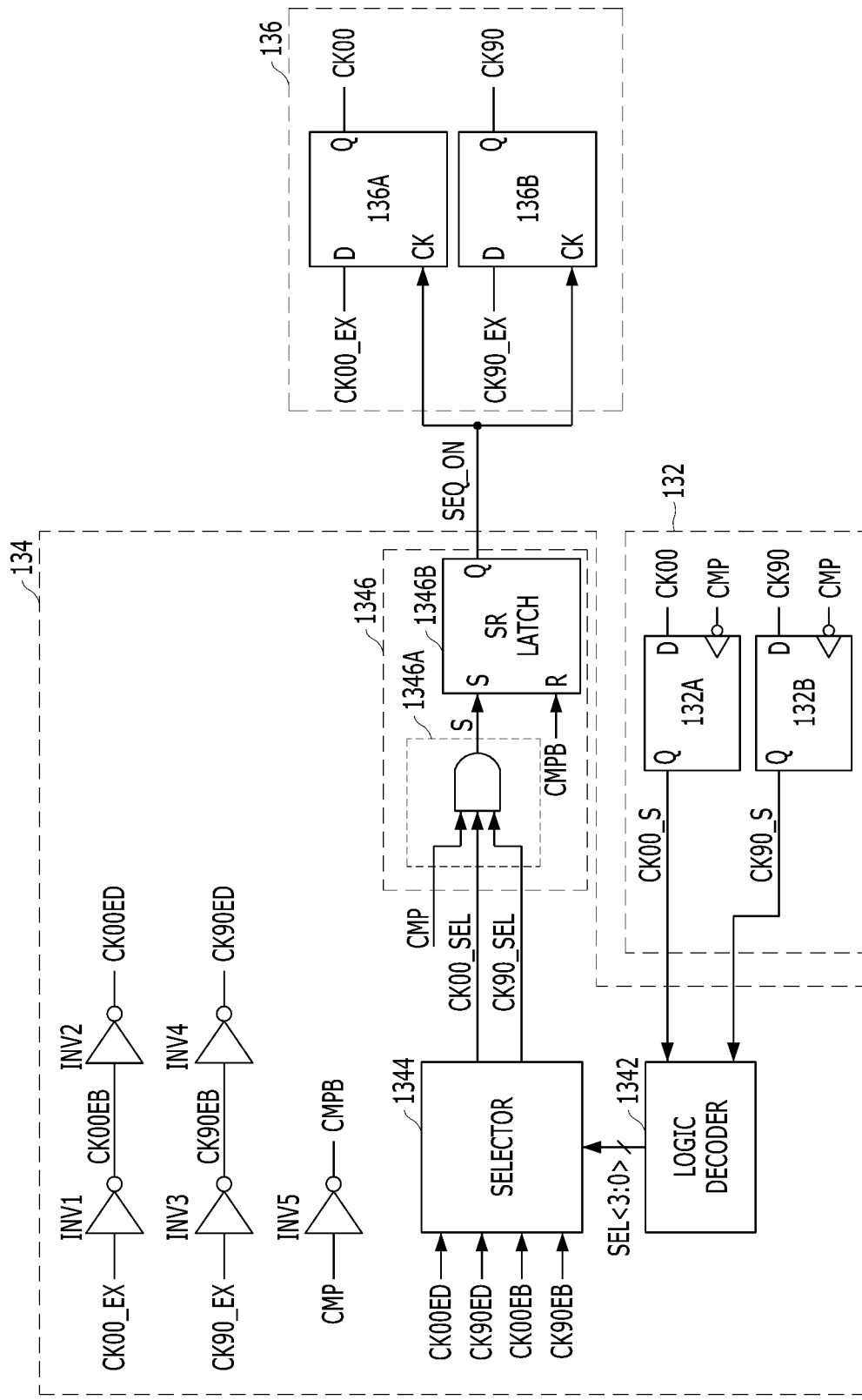
FIG. 6 is a circuit diagram illustrating a driving control circuit, such as that shown in FIG. 5, in accordance with an embodiment of the present disclosure.

FIG. 6 is a circuit diagram illustrating the driving control circuit 130 shown in FIG. 5 in accordance with an embodiment of the present disclosure. FIG. 7 is a table describing an operation of the driving control circuit 130 shown in FIG. 6 in accordance with an embodiment of the present disclosure.

Referring to FIG. 6, detailed circuit diagrams of the previous clock storing circuit 132, the sequence determination circuit 134 and the output control circuit 136 are shown.

The previous clock storing circuit 132 may include a first storage 132A and a second storage 132B. The first storage 132A may store the first main clock CK00 to output the first preliminary clock CK00_S, at the end of the activation section/time period of the comparison signal CMP. The second storage 132B may store the second main clock CK90 to output the second preliminary clock CK90_S, at the end of the activation section/time period of the comparison signal CMP. Preferably, the first storage 132A and the second storage 132B may be implemented with D flip-flop which is synchronized with the falling edge of the comparison signal CMP.

The sequence determination circuit 134 may include a logic decoder 1342, a selector 1344, and an enable signal generator 1346.

The logic decoder 1342 may generate the selection signal SEL<3:0> by decoding logic levels of the first and second preliminary clocks CK00_S and CK90_S. For example, as shown in FIG. 7, the logic decoder 1342 may generate the selection signal SEL<3:0> of "0001" when both of the first and second preliminary clocks CK00_S and CK90_S have a logic low level. The logic decoder 1342 may generate the selection signal SEL<3:0> of "0010" when the first preliminary clock CK00_S has a logic high level and the second preliminary clock CK90_S has a logic low level. The logic decoder 1342 may generate the selection signal SEL<3:0> of "0100" when the first preliminary clock CK00_S has a logic low level and the second preliminary clock CK90_S has a logic high level. The logic decoder 1342 may generate the selection signal SEL<3:0> of "1000" when both of the first and second preliminary clocks CK00_S and CK90_S have a logic high level.

The sequence determination circuit 134 may further include first to fifth inverters INV1 to INV5. The first inverter INV1 may invert the first external clock CK00_EX to output a first negative clock CK00EB, and the second inverter INV2 may invert the first negative clock CK00EB to output a first positive clock CK00ED. The third inverter INV3 may invert the second external clock CK90_EX to output a second negative clock CK90EB, and the fourth inverter INV4 may invert the second negative clock CK90EB to output a second positive clock CK90ED. The fifth inverter INV5 may invert the comparison signal CMP to output an inverted comparison signal CMPB.

The selector 1344 may select one of the first positive clock CK00ED and the first negative clock CK00EB according to the selection signal SEL<3:0>, and output the first sequence selection signal CK00_SEL. The selector 1344 may select one of the second positive clock CK90ED and the second negative clock CK90EB according to the selection signal SEL<3:0>, and output the second sequence selection signal CK90_SEL. For example, as shown in FIG. 7, the selector 1344 may output the first sequence selection signal CK00_SEL and the second sequence selection signal CK90_SEL by selecting the first negative clock CK00EB and the second negative clock CK90EB, respectively, according to the selection signal SEL<3:0> of "0001". The selector 1344 may output the first sequence selection signal CK00_SEL and the second sequence selection signal CK90_SEL by selecting the first positive clock CK00ED and the second negative clock CK90EB, respectively, according to the selection signal SEL<3:0> of "0010". The selector 1344 may output the first sequence selection signal CK00_SEL and the second sequence selection signal CK90_SEL by selecting the first negative clock CK00EB and the second positive clock CK90ED, respectively, according to the selection signal SEL<3:0> of "0100". The selector 1344 may output the first sequence selection signal CK00_SEL and the second sequence selection signal CK90_SEL by selecting the first positive clock CK00ED and the second positive clock CK90ED, respectively, according to the selection signal SEL<3:0> of "1000".

The enable signal generator 1346 may activate the output enable signal SEQ_ON in response to the first sequence selection signal CK00_SEL and the second sequence selection signal CK90_SEL, during the activation section of the comparison signal CMP. The enable signal generator 1346 may deactivate the output enable signal SEQ_ON at the end of the activation section/time period of the comparison signal CMP. That is, the enable signal generator 1346 may deactivate the output enable signal SEQ_ON in synchronization with a falling edge of the comparison signal CMP. In detail, the enable signal generator 1346 may include a set signal generator 1346A and a Set/Reset (SR) latch 1346B.

The set signal generator 1346A may generate a set signal S according to the comparison signal CMP, the first sequence selection signal CK00_SEL and the second sequence selection signal CK90_SEL. The set signal generator 1346A may be implemented with a logic gate for performing a logic AND operation on the comparison signal CMP, the first sequence selection signal CK00_SEL and the second sequence selection signal CK90_SEL. The set signal generator 1346A may activate the set signal S to a logic high level during the activation section of the comparison signal CMP, when both of the first sequence selection signal CK00_SEL and the second sequence selection signal CK90_SEL become a logic high level.

The SR latch 1346B may output the output enable signal SEQ_ON which is activated in response to the set signal S and deactivated in response to the inverted comparison signal CMPB.

The output control circuit 136 may include a first latch 136A and a second latch 136B. The first latch 136A may latch the first external clock CK00_EX and output the first main clock CK00, according to the output enable signal SEQ_ON. The first latch 136A may latch the first external clock CK00_EX to output the first main clock CK00 when the output enable signal SEQ_ON is activated, and maintain a level of the first main clock CK00 which is previously latched when the output enable signal SEQ_ON is deactivated. The second latch 136B may latch the second external clock CK90_EX and output the second main clock CK90, according to the output enable signal SEQ_ON. The second latch 136B may latch the second external clock CK090_EX to output the second main clock CK90 when the output enable signal SEQ_ON is activated, and maintain a level of the second main clock CK90 which is previously latched when the output enable signal SEQ_ON is deactivated.

Hereinafter, referring to FIGS. 5 to 8, an operation of the semiconductor device 100 are described in detail.

Figure 8:
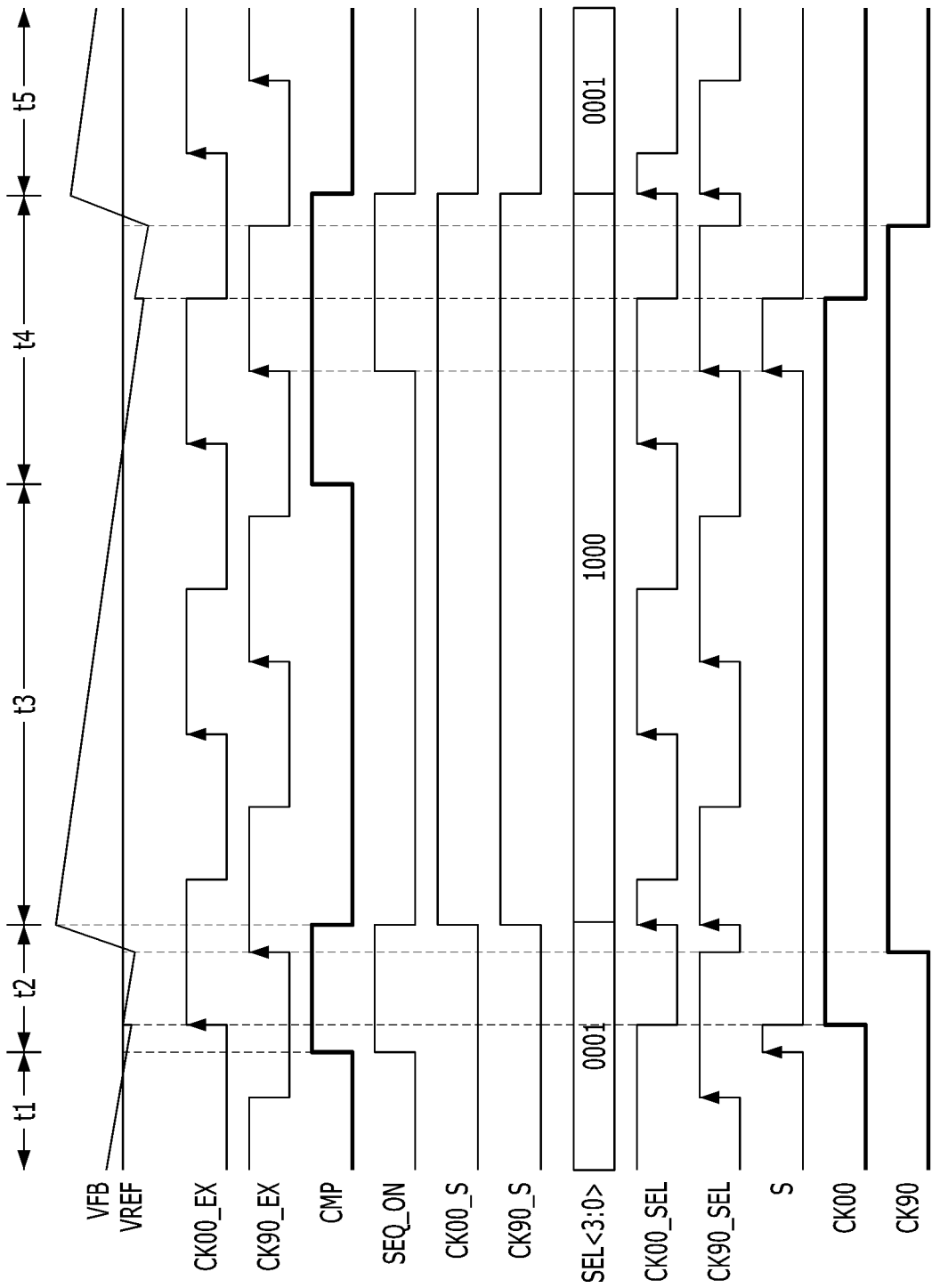
FIG. 8 is a timing diagram describing an operation of a semiconductor device in accordance with an embodiment of the present disclosure.

FIG. 8 is a timing diagram describing an operation of a semiconductor device in accordance with an embodiment of the present disclosure.

Referring to FIG. 8, during a first section t1, the detection voltage VFB is greater than or equal to the reference voltage VREF. The voltage detection circuit 120 deactivates the comparison signal CMP to a logic low level. The sequence determination circuit 134 deactivates the output enable signal SEQ_ON to a logic low level. The output control circuit 136 maintains levels of the first and second main clocks CK00 and CK90 without toggling. Accordingly, the charge pump circuit 110 does not perform a pumping operation on the input voltage VIN. Since the previous clock storing circuit 132 stores the first and second preliminary clocks CK00_S and CK90_S of a logic low level, the sequence determination circuit 134 outputs the first sequence selection signal CK00_SEL by inverting the first external clock CK00_EX and outputs the second sequence selection signal CK90_SEL by inverting the second external clock CK90_EX, according to the selection signal SEL<3:0> of "0001".

During a second section t2, the detection voltage VFB becomes lower than the reference voltage VREF. The voltage detection circuit 120 activates the comparison signal CMP to a logic high level. Since the previous clock storing circuit 132 still stores the first and second preliminary clocks CK00_S and CK90_S of a logic low level, the sequence determination circuit 134 outputs the first sequence selection signal CK00_SEL by inverting the first external clock CK00_EX and outputs the second sequence selection signal CK90_SEL by inverting the second external clock CK90_EX, according to the selection signal SEL<3:0> of "0001". The sequence determination circuit 134 activates the set signal S during the activation section of the comparison signal CMP, when both of the first sequence selection signal CK00_SEL and the second sequence selection signal CK90_SEL become a logic high level. The sequence determination circuit 134 activates the output enable signal SEQ_ON in response to the set signal S. The output control circuit 136 outputs the first and second main clocks CK00 and CK90 by latching the first and second external clocks CK00_EX and CK90_EX according to the output enable signal SEQ_ON. Accordingly, the charge pump circuit 110 performs a pumping operation on the input voltage VIN to increase a level of the output voltage VOUT, i.e., the detection voltage VFB.

During a third section t3, the detection voltage VFB becomes greater than the reference voltage VREF. The voltage detection circuit 120 deactivates the comparison signal CMP to a logic low level. The sequence determination circuit 134 deactivates the output enable signal SEQ_ON. The output control circuit 136 maintains the levels of the first and second main clocks CK00 and CK90 without toggling. Accordingly, the charge pump circuit 110 does not perform a pumping operation on the input voltage VIN. At the end of the activation section/time period of the comparison signal CMP, the previous clock storing circuit 132 stores the first and second main clocks CK00 and CK90 of a logic high level as the first and second preliminary clocks CK00_S and CK90_S, respectively. The sequence determination circuit 134 generates the selection signal SEL<3:0> of "1000" according to the first and second preliminary clocks CK00_S and CK90_S of a logic high level. According to the selection signal SEL<3:0> of "1000", the sequence determination circuit 134 outputs the first external clock CK00_EX as the first sequence selection signal CK00_SEL, and outputs the second external clock CK90_EX as the second sequence selection signal CK90_SEL.

During a fourth section t4, the detection voltage VFB becomes lower than the reference voltage VREF. The voltage detection circuit 120 activates the comparison signal CMP to a logic high level. Since the first and second preliminary clocks CK00_S and CK90_S maintain a logic high level, the sequence determination circuit 134 outputs the first external clock CK00_EX as the first sequence selection signal CK00_SEL, and outputs the second external clock CK90_EX as the second sequence selection signal CK90_SEL. The sequence determination circuit 134 activates the set signal S during the activation section of the comparison signal CMP, when both of the first sequence selection signal CK00_SEL and the second sequence selection signal CK90_SEL become a logic high level. The sequence determination circuit 134 activates the output enable signal SEQ_ON in response to the set signal S. Even if the comparison signal CMP is activated to a logic high level, the output enable signal SEQ_ON is not immediately activated, but the output enable signal SEQ_ON is activated when a transition sequence of the first and second external clocks CK00_EX and CK90_EX meets the certain condition. That is, the output enable signal SEQ_ON is activated when both of the first sequence selection signal CK00_SEL and the second sequence selection signal CK90_SEL become a logic high level. The output control circuit 136 outputs the first and second main clocks CK00 and CK90 by latching the first and second external clocks CK00_EX and CK90_EX according to the output enable signal SEQ_ON. Accordingly, the charge pump circuit 110 performs a pumping operation on the input voltage VIN to increase a level of the output voltage VOUT, i.e., the detection voltage VFB.

During a fifth section t5, the voltage detection circuit 120 deactivates the comparison signal CMP to a logic low level. The sequence determination circuit 134 deactivates the output enable signal SEQ_ON. At the end of the activation section/time period of the comparison signal CMP, the previous clock storing circuit 132 stores the first and second main clocks CK00 and CK90 of a logic low level as the first and second preliminary clocks CK00_S and CK90_S, respectively. According to the selection signal SEL<3:0> of "0001", the sequence determination circuit 134 outputs the first sequence selection signal CK00_SEL by inverting the first external clock CK00_EX and outputs the second sequence selection signal CK90_SEL by inverting the second external clock CK90_EX.

As described above, the driving control circuit 130 of the semiconductor device 100 in accordance with an embodiment may output the first and second main clocks CK00 and CK90 by determining whether a transition sequence of the first and second external clocks CK00_EX and CK90_EX meets a certain condition, based on logic levels of the first and second preliminary clocks CK00_S and CK90_S, during the activation section of the comparison signal CMP. Further, the driving control circuit 130 may control the first and second main clocks CK00 and CK90 to maintain their logic levels by storing the first and second main clocks CK00 and CK90 as the first and second preliminary clocks CK00_S and CK90_S, respectively, at the end of the activation section/time period of the comparison signal CMP. Accordingly, the semiconductor device 100 can control the first and second main clocks CK00 and CK90 not to simultaneously transition, and can minimize/reduce current consumption due to unnecessary switching operations.

Figure 9A:
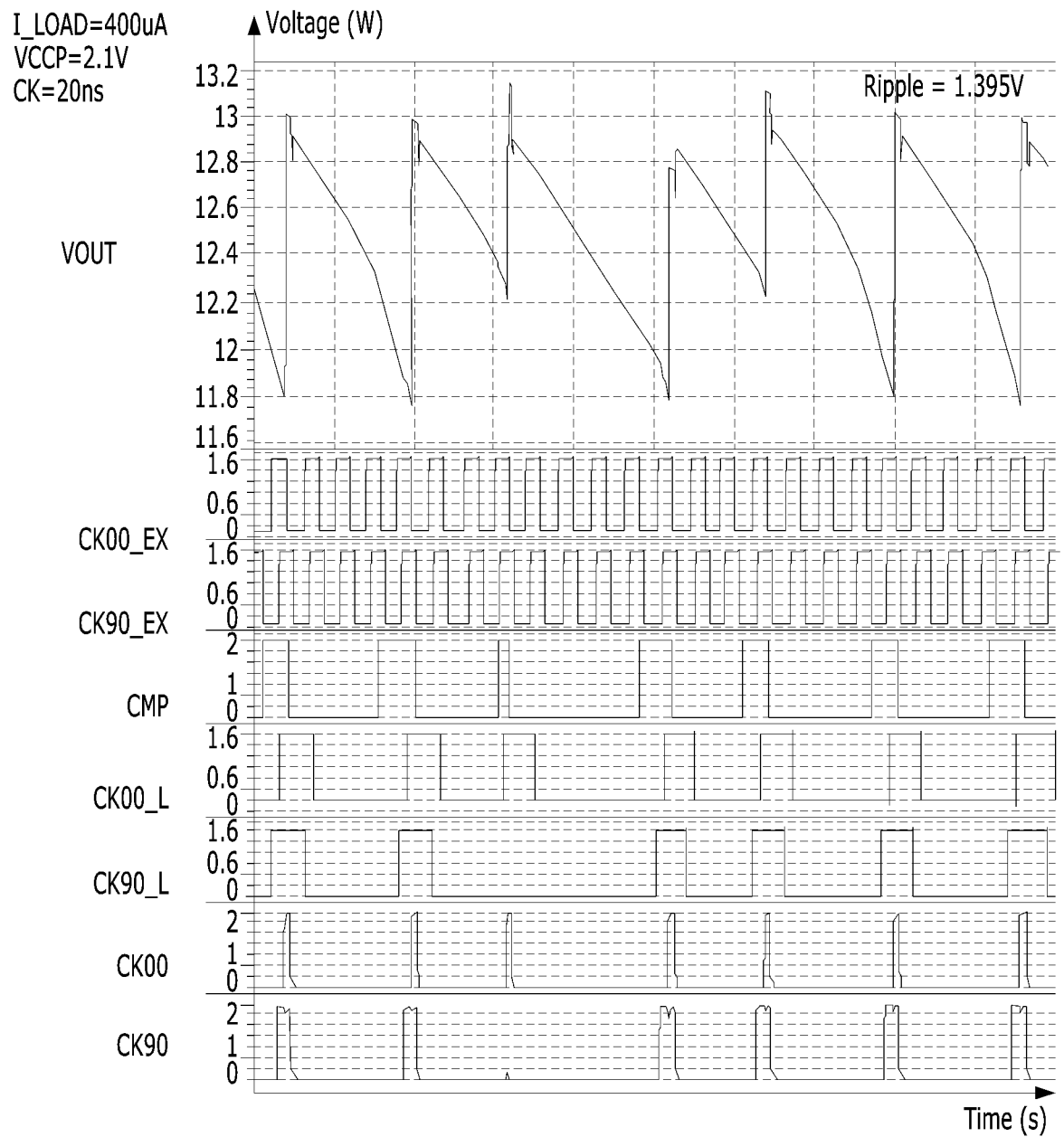
FIGS. 9A and 9B are timing diagrams describing an operation of a semiconductor device in the context of a comparative example, and an operation of a semiconductor device according to an embodiment of the present disclosure, respectively.
Figure 9B:
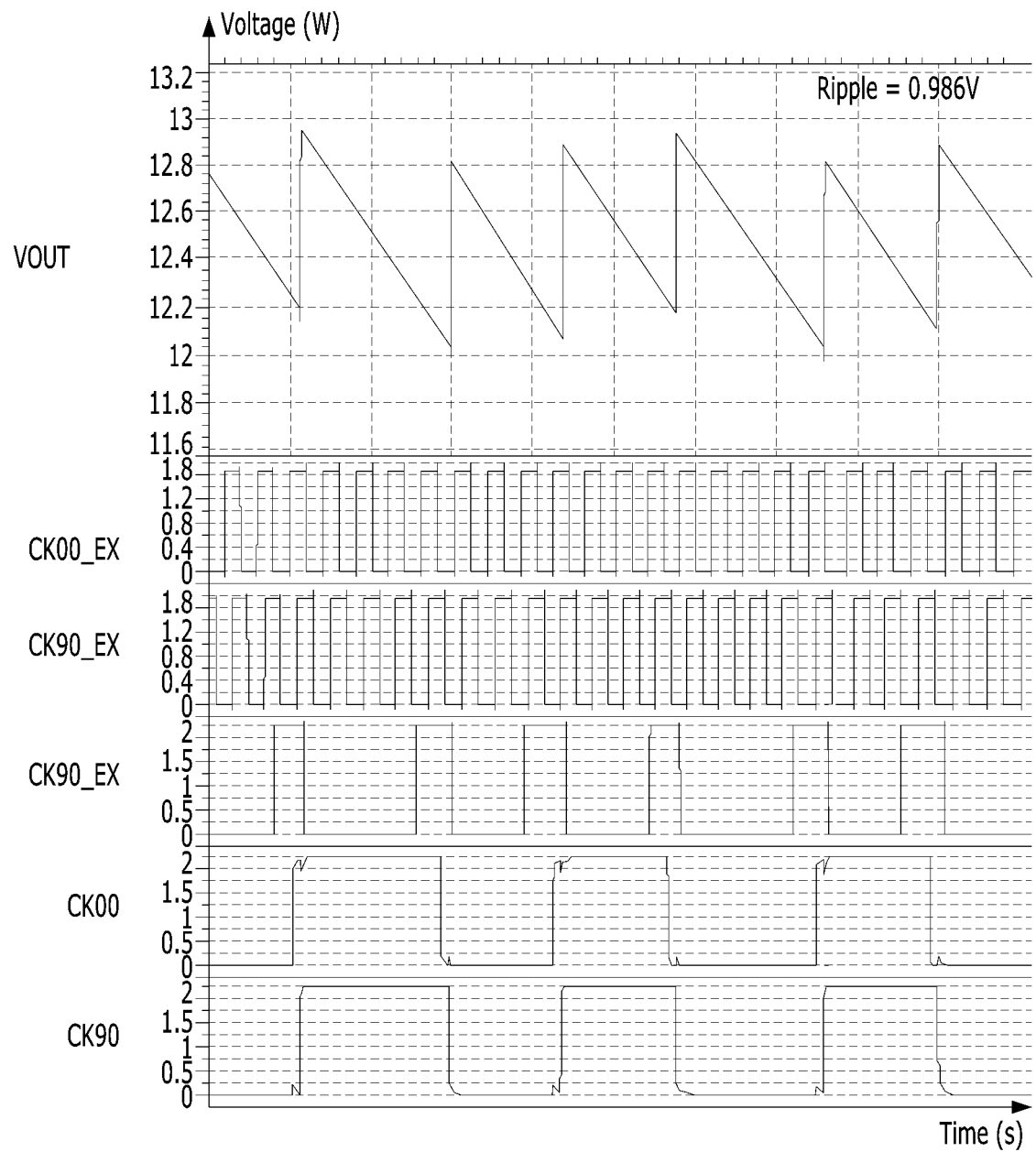

FIG. 9A is a timing diagram describing an operation of a semiconductor device according to a comparative example in accordance with an embodiment of the present disclosure. FIG. 9B is a timing diagram describing an operation of a semiconductor device according to an embodiment of the present disclosure.

Referring to FIG. 9A, in a case of the semiconductor device according to the comparative example, e.g., the semiconductor device 20 of FIG. 3, first and second main clocks CK00 and CK90 simultaneously transition at an end of an activation section/time period of a comparison signal CMP. Thus, a peak current consumed due to such switching operations may increase, thereby increasing a ripple voltage up to 1.395V. Further, during the activation section of the comparison signal CMP, only the first main clock CK00 toggles, without toggling the second main clock CK90, which increases a current consumption due to unnecessary switching operations.

Referring to FIG. 9B, according to an embodiment, in a semiconductor device, e.g., the semiconductor device 100 of FIG. 5, first and second main clocks CK00 and CK90 maintain their logic levels at an end of an activation section/time period of a comparison signal CMP. Since a situation in which the first and second main clocks CK00 and CK90 simultaneously transition is eliminated, a peak current may decrease, thereby decreasing a ripple to 0.986V. Further, by controlling a transition sequence such that the second main clock CK90 transitions after the first main clock CK00 transitions, unnecessary switching operations are eliminated, thereby minimizing/reducing current consumption.

Hereinafter, this disclosure proposes a semiconductor device capable of not only reducing an input current of clocks provided to a charge pump circuit, but also minimizing a clock waiting time.

Figure 10:
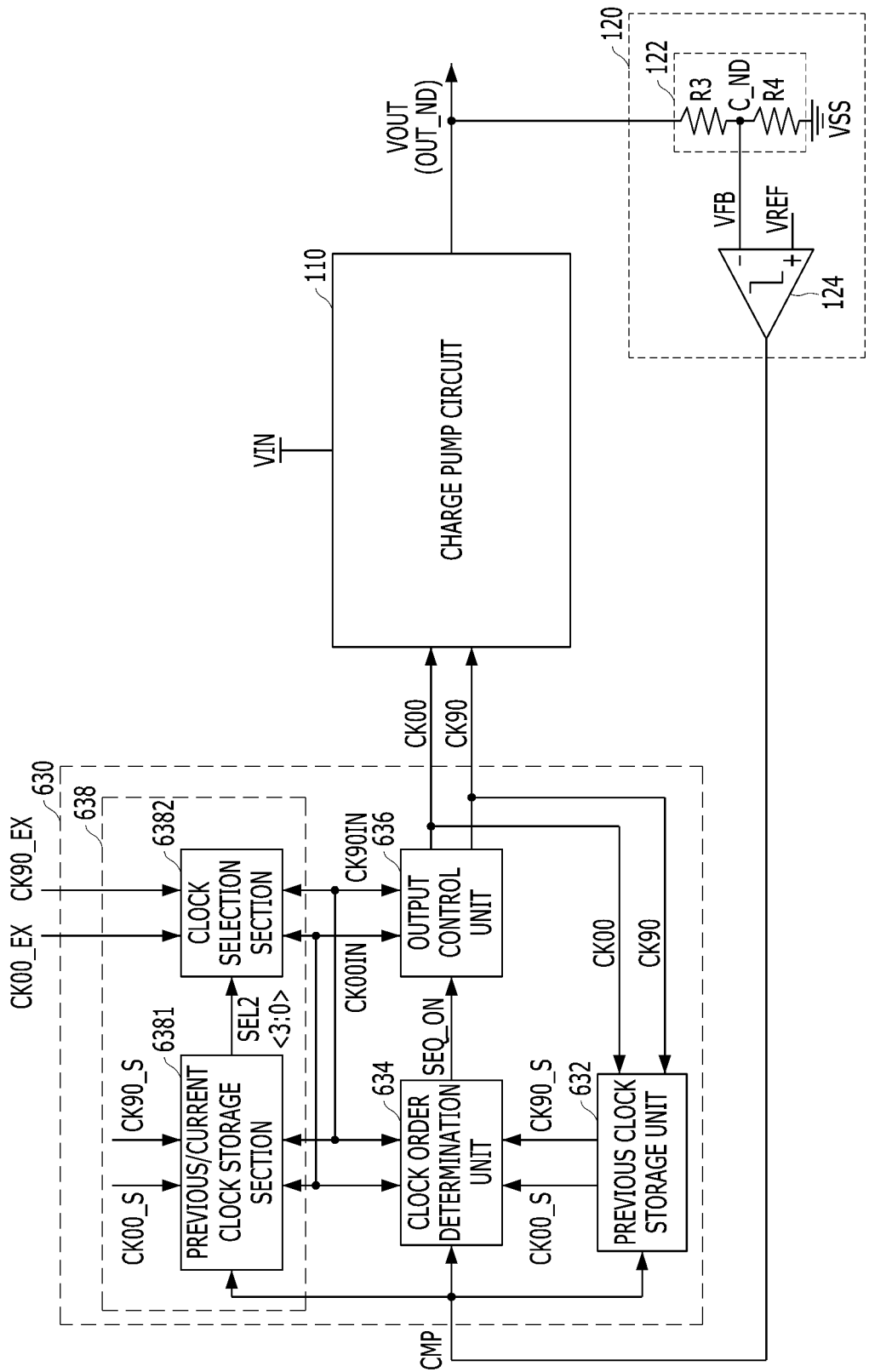
FIG. 10 is a configuration diagram of a semiconductor device adopting a charge pump circuit in accordance with another embodiment of the present disclosure.

FIG. 10 is a configuration diagram of a semiconductor device 100 adopting a charge pump circuit in accordance with another embodiment of the present disclosure.

Referring to FIG. 10, the semiconductor device 100 may include a charge pump circuit 110, a voltage detection circuit 120, and a driving control circuit 630.

The charge pump circuit 110 may generate an output voltage VOUT by pumping an input voltage VIN according to a first main clock CK00 and a second main clock CK90. The charge pump circuit 110 may have substantially the same configuration as that of the charge pump circuit 10 described with reference to FIG. 1 and FIG. 2.

The voltage detection circuit 120 may generate a comparison signal CMP by comparing the output voltage VOUT with a reference voltage VREF. The voltage detection circuit 120 may include a divider 122 and a comparator 124. The divider 122 may divide the output voltage VOUT and provide the divided voltage as a detection voltage VFB. The divider 122 may include first and second resistors R3 and R4 connected in series to an output terminal OUT_ND and a ground voltage VSS terminal, and the detection voltage VFB may be outputted from a common node C_ND of the first and second resistors R3 and R4. The comparator 124 may output the comparison signal CMP by comparing the reference voltage VREF with the detection voltage VFB. When the detection voltage VFB is less than or equal to the reference voltage VREF, the comparator 124 may activate the comparison signal CMP to a high level and output the activated comparison signal CMP. Preferably, the reference voltage VREF may use a bandgap voltage BANDGAP VOLTAGE having a constant voltage level regardless of a change in a voltage supplied from an exterior.

The driving control circuit 630 may selectively invert a first external clock CK00_EX and a second external clock CK90_EX at a start time point of an activation period of the comparison signal CMP to generate as a first internal clock CK00IN and a second internal clock CK90IN. Furthermore, at an end time point of the activation period of the comparison signal CMP, the driving control circuit 630 may store logic levels of the first main clock CK00 and the second main clock CK90 as a first preliminary clock CK00_S and a second preliminary clock CK90_S, respectively. Particularly, the driving control circuit 630 in accordance with the present disclosure may selectively invert the first external clock CK00_EX and the second external clock CK90_EX according to the respective logic levels of the first preliminary clock CK00_S, the second preliminary clock CK90_S, the first external clock CK00_EX, and the second external clock CK90_EX to generate as the first internal clock CK00IN and the second internal clock CK90IN.

Furthermore, during the activation period of the comparison signal CMP, the driving control circuit 630 may generate the first main clock CK00 and the second main clock CK90 according to the first internal clock CK00IN and the second internal clock CK90IN. Particularly, the driving control circuit 630 in accordance with the present disclosure may control a transition order so that the first main clock CK00 transitions and then the second main clock CK90 transitions. That is, during the activation period of the comparison signal CMP, the driving control circuit 630 may control the transition order so that the first main clock CK00 transitions from a logic low level to a logic high level and then the second main clock CK90 transitions from a logic low level to a logic high level, and the first main clock CK00 transitions from a logic high level to a logic low level and then the second main clock CK90 transitions from a logic high level to a logic low level.

More specifically, the driving control circuit 630 may include a previous clock storage unit 632, a clock input unit 638, a clock order determination unit 634, and an output control unit 636. The clock input unit 638 may include a previous/current clock storage section 6381 and a clock selection section 6382.

The previous clock storage unit 632 may store the first main clock CK00 and the second main clock CK90 as the first preliminary clock CK00_S and the second preliminary clock CK90_S, respectively, according to the comparison signal CMP. Preferably, at the end time point of the activation period of the comparison signal CMP, that is, in synchronization with a falling edge of the comparison signal CMP, the previous clock storage unit 632 may store the first main clock CK00 and the second main clock CK90 as the first preliminary clock CK00_S and the second preliminary clock CK90_S, respectively.

The clock input unit 638 may selectively invert the first external clock CK00_EX and the second external clock CK90_EX according to the respective logic levels of the first preliminary clock CK00_S, the second preliminary clock CK90_S, the first internal clock CK00IN, and the second internal clock CK90IN on the basis of the comparison signal CMP to generate as the first internal clock CK00IN and the second internal clock CK90IN.

The previous/current clock storage section 6381 included in the clock input unit 638 may store the respective logic levels of the first internal clock CK00IN, the second internal clock CK90IN, the first preliminary clock CK00_S, and the second preliminary clock CK90_S as a second selection signal SEL2<3:0> at the start time point of the activation period of the comparison signal CMP. More specifically, at the start time point of the activation period of the comparison signal CMP, the previous/current clock storage section 6381 may store the logic level of the first preliminary clock CK00_S and output the stored logic level as a first bit SEL2<0> of the second selection signal SEL2<3:0>, may store the logic level of the second preliminary clock CK90_S and output the stored logic level as a second bit SEL2<1> of the second selection signal SEL2<3:0>, may store the logic level of the first internal clock CK00IN and output the stored logic level as a third bit SEL2<2> of the second selection signal SEL2<3:0>, and may store the logic level of the second internal clock CK90IN and output the stored logic level as a fourth bit SEL2<3> of the second selection signal SEL2<3:0>.

The clock selection section 6382 included in the clock input unit 638 may selectively invert the first external clock CK00_EX and the second external clock CK90_EX in response to the second selection signal SEL2<3:0> to generate as the first internal clock CK00IN and the second internal clock CK90IN. More specifically, the clock selection section 6382 may select one of the first external clock CK00_EX and an inverted first external clock CK00_EXB according to the second selection signal SEL2<3:0> as the first internal clock CK00IN, and select one of the second external clock CK90_EX and an inverted second external clock CK90_EXB according to the second selection signal SEL2<3:0> the selected clock as the second internal clock CK90IN.

The clock order determination unit 634 may determine whether the transition order of the first internal clock CK00IN and the second internal clock CK90IN satisfies a specific condition, on the basis of the first preliminary clock CK00_S and the second preliminary clock CK90_S, and generate an output activation signal SEQ_ON during the activation period of the comparison signal CMP. The specific condition may include a case where the first internal clock CK00IN transitions from a logic low level to a logic high level and then the second internal clock CK90IN transitions from a logic low level to a logic high level, and a case where the first internal clock CK00IN transitions from a logic high level to a logic low level and then the second internal clock CK90IN transitions from a logic high level to a logic low level. More specifically, the clock order determination unit 634 may generate a first selection signal SEL1<3:0> (see FIG. 11) by decoding the logic levels of the first preliminary clock CK00_S and the second preliminary clock CK90_S, select one of the first internal clock CK00IN and an inverted first internal clock CK00INB according to the first selection signal SEL1<3:0> and output the selected clock as a first order determination signal CK00_SEL (see FIG. 11), and select one of the second internal clock CK90IN and an inverted second internal clock CK90INB according to the first selection signal SEL1<3:0> and output the selected clock as a second order determination signal CK90_SEL (see FIG. 11). Furthermore, the clock order determination unit 634 may generate the output activation signal SEQ_ON according to the comparison signal CMP, the first order determination signal CK00_SEL, and the second order determination signal CK90_SEL.

The output control unit 636 may latch the first internal clock CK00IN and the second internal clock CK90IN according to the output activation signal SEQ_ON, and output the first main clock CK00 and the second main clock CK90.

As described above, at the start time point of the activation period of the comparison signal CMP, the driving control circuit 630 in accordance with an embodiment of the present disclosure may selectively invert the first external clock CK00_EX and the second external clock CK90_EX to generate as the first internal clock CK00IN and the second internal clock CK90IN. Accordingly, when the phases of the first external clock CK00_EX and the second external clock CK90_EX do not have preferred phases at the start time point of the activation period of the comparison signal CMP, the semiconductor device 100 in accordance with the present disclosure may selectively invert the first external clock CK00_EX and the second external clock CK90_EX to generate as the first internal clock CK00IN and the second internal clock CK90IN having preferred phases, instead of waiting until the first external clock CK00_EX and the second external clock CK90_EX have the preferred phases.

Furthermore, the driving control circuit 630 may control the second main clock CK90 to be toggled after the first main clock CK00 is toggled, thereby substantially maintaining the transition order of the first main clock CK00 and the second main clock CK90. Furthermore, the driving control circuit 630 may control the logic levels of the first main clock CK00 and the second main clock CK90 to be substantially maintained at the end time point of the activation period of the comparison signal CMP. Accordingly, the semiconductor device 100 in accordance with the present disclosure may control the first main clock CK00 and the second main clock CK90 not to be transitioned at the same time, thereby reducing current consumed by an unnecessary switching operation.

Figure 11:
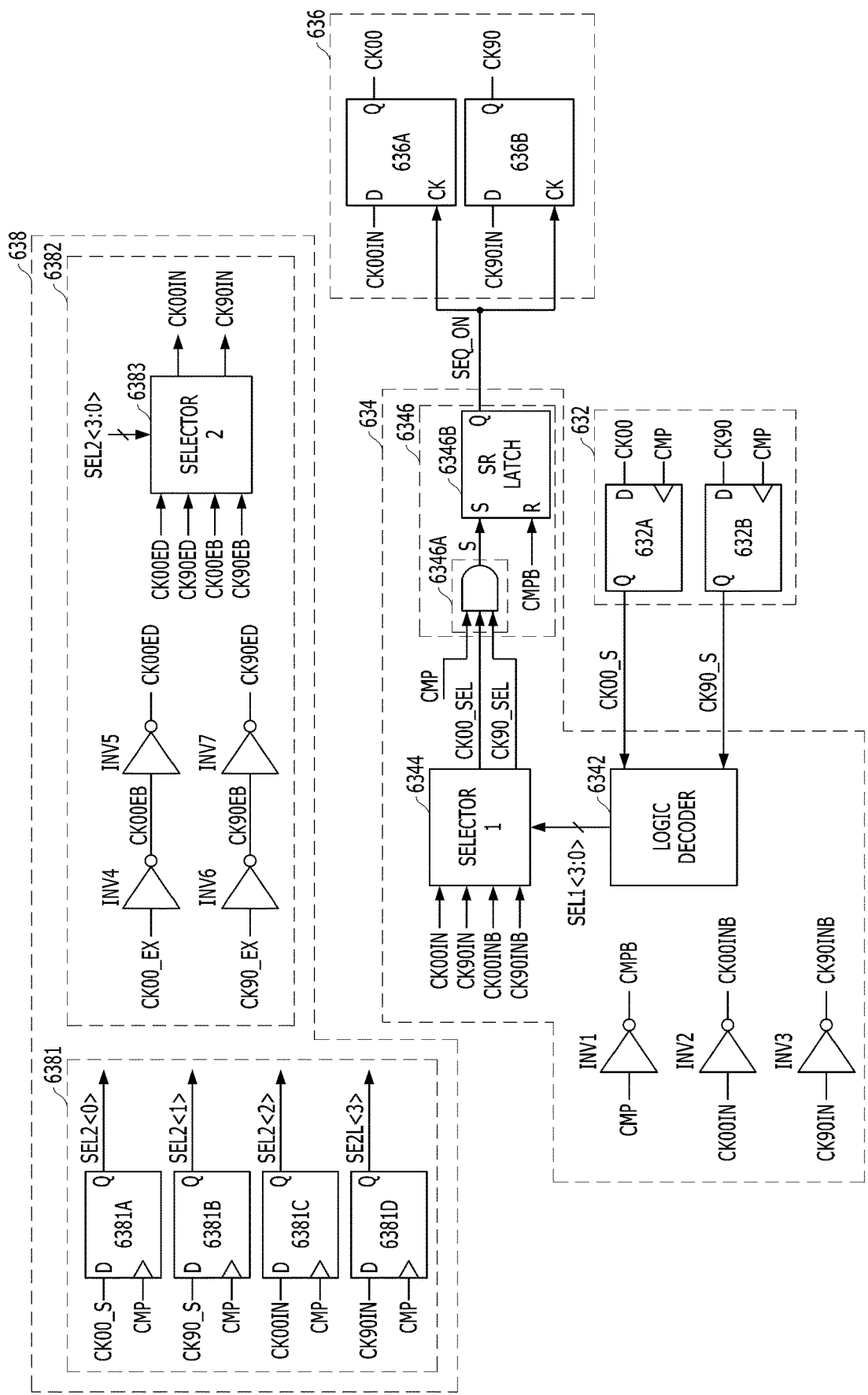
FIG. 11 is a detailed circuit diagram of a driving control circuit in FIG. 10 in accordance with an embodiment of the present disclosure.

FIG. 11 is a detailed circuit diagram of the driving control circuit 630 in FIG. 10 in accordance with an embodiment of the present disclosure. FIG. 12 is a table for describing an operation of the driving control circuit 630 in FIG. 11 in accordance with an embodiment of the present disclosure.

In FIG. 11, a detailed circuit diagram of the previous clock storage unit 632, the clock input unit 638, the clock order determination unit 634, and the output control unit 636 is illustrated. Furthermore, in FIG. 11, a detailed circuit diagram of the previous/current clock storage section 6381 and the clock selection section 6382 included in the clock input unit 638 is illustrated.

The previous clock storage unit 632 may include a first storage section 632A and a second storage section 632B. The first storage section 632A may store the first main clock CK00 and output the stored first main clock CK00 as the first preliminary clock CK00_S at the end time point of the activation period of the comparison signal CMP. The second storage section 632B may store the second main clock CK90 and output the stored second main clock CK90 as the second preliminary clock CK90_S at the end time point of the activation period of the comparison signal CMP. Preferably, each of the first storage section 632A and the second storage section 632B may be implemented as a D flip-flop.

The clock order determination unit 634 may include a logic decoder 6342, a first selector 6344, and an activation signal generation section 6346.

The logic decoder 6342 may generate the first selection signal SEL1<3:0> by decoding the logic levels of the first preliminary clock CK00_S and the second preliminary clock CK90_S. For example, as illustrated in FIG. 12, the logic decoder 6342 may generate the first selection signal SEL1<3:0> of "0001" when both the first preliminary clock CK00_S and the second preliminary clock CK90_S are at a logic low level, may generate the first selection signal SEL1<3:0> of "0010" when the first preliminary clock CK00_S is at a logic high level and the second preliminary clock CK90_S is at a logic low level, may generate the first selection signal SEL1<3:0> of "0100" when the first preliminary clock CK00_S is at a logic low level and the second preliminary clock CK90_S is at a logic high level, and may generate the first selection signal SEL1<3:0> of "1000" when both the first preliminary clock CK00_S and the second preliminary clock CK90_S are at a logic high level.

In addition, the clock order determination unit 634 may additionally include first to third inverters INV1 to INV3. The first inverter INV1 may generate an inverted comparison signal CMPB by inverting the comparison signal CMP. The second inverter INV2 may generate the inverted first internal clock CK00INB by inverting the first internal clock CK00IN. The third inverter INV3 may generate the inverted second internal clock CK90INB by inverting the second internal clock CK90IN.

The first selector 6344 may select one of the inverted first internal clock CK00INB and the first internal clock CK00IN according to the first selection signal SEL1<3:0> and output the selected clock as the first order determination signal CK00_SEL, and select one of the inverted second internal clock CK90INB and the second internal clock CK90IN according to the first selection signal SEL1<3:0> and output the selected clock as the second order determination signal CK90_SEL. For example, as illustrated in FIG. 12, the first selector 6344 may output the inverted first internal clock CK00INB and the inverted second internal clock CK90INB as the first order determination signal CK00_SEL and the second order determination signal CK90_SEL, respectively, according to the first selection signal SEL1<3:0> of "0001". The first selector 6344 may output the first internal clock CK00IN and the inverted second internal clock CK90INB as the first order determination signal CK00_SEL and the second order determination signal CK90_SEL, respectively, according to the first selection signal SEL1<3:0> of "0010". The first selector 6344 may output the inverted first internal clock CK00INB and the second internal clock CK90IN as the first order determination signal CK00_SEL and the second order determination signal CK90_SEL, respectively, according to the first selection signal SEL1<3:0> of "0100". The first selector 6344 may output the first internal clock CK00IN and the second internal clock CK90IN as the first order determination signal CK00_SEL and the second order determination signal CK90_SEL, respectively, according to the first selection signal SEL1<3:0> of "1000".

The activation signal generation section 6346 may activate the output activation signal SEQ_ON according to the first order determination signal CK00_SEL and the second order determination signal CK90_SEL during the activation period of the comparison signal CMP. The activation signal generation section 6346 may deactivate the output activation signal SEQ_ON at the end time point of the activation period of the comparison signal CMP, that is, according to the falling edge of the comparison signal CMP.

More specifically, the activation signal generation section 6346 may include a set signal generation part 6346A and an SR latch 6346B.

The set signal generation part 6346A may generate a set signal S according to the comparison signal CMP, the first order determination signal CK00_SEL, and the second order determination signal CK90_SEL. Preferably, the set signal generation part 6346A may generate the set signal S by performing a logic AND operation on the comparison signal CMP, the first order determination signal CK00_SEL, and the second order determination signal CK90_SEL. That is, during the activation period of the comparison signal CMP, the set signal generation part 6346A may output the set signal S that is activated to a logic high level when both the first order determination signal CK00_SEL, and the second order determination signal CK90_SEL are at a logic high level. The SR latch 6346B may generate the output activation signal SEQ_ON that is activated according to the set signal S and is deactivated according to the inverted comparison signal CMPB.

The previous/current clock storage section 6381 included in the clock input unit 638 may include a third storage part 6381A, a fourth storage part 6381B, a fifth storage part 6381C, and a sixth storage part 6381D. The third storage part 6381A may store the first preliminary clock CK00_S and output the stored first preliminary clock CK00_S as the first bit SEL2<0> of the second selection signal SEL2<3:0>, at the start time point of the activation period of the comparison signal CMP. The fourth storage part 6381B may store the second preliminary clock CK90_S and output the stored second preliminary clock CK90_S as the second bit SEL2<1> of the second selection signal SEL2<3:0>, at the start time point of the activation period of the comparison signal CMP. The fifth storage part 6381C may store the first internal clock CK00IN and output the stored first internal clock CK00IN as the third bit SEL2<2> of the second selection signal SEL2<3:0>, at the start time point of the activation period of the comparison signal CMP. The sixth storage part 6381D may store the second internal clock CK90IN and output the stored second internal clock CK90IN as the fourth bit SEL2<3> of the second selection signal SEL2<3:0>, at the start time point of the activation period of the comparison signal CMP. Preferably, each of the third storage part 6381A, the fourth storage part 6381B, the fifth storage part 6381C, and the sixth storage part 6381D may be implemented as a D flip-flop.

The clock selection section 6382 included in the clock input unit 638 may include a second selector 6383 and fourth to seventh inverters INV4 to INV7.

The fourth inverter INV4 may generate a first clock bar CK00EB by inverting the first external clock CK00_EX, and the fifth inverter INV5 may generate a first clock CK00ED by inverting the first clock bar CK00EB. The sixth inverter INV6 may generate a second clock bar CK90EB by inverting the second external clock CK90_EX, and the seventh inverter INV7 may generate a second clock CK90ED by inverting the second clock bar CK90EB.

The second selector 6383 may select one of the first clock bar CK00EB and the first clock CK00ED according to the second selection signal SEL2<3:0> and output the selected clock as the first internal clock CK00IN, and select one of the second clock bar CK90EB and the second clock CK90ED according to the second selection signal SEL2<3:0> and output the selected clock as the second internal clock CK90IN. For example, as illustrated in FIG. 12, the second selector 6383 may output the first clock CK00ED and the second clock CK90ED as the first internal clock CK00IN and the second internal clock CK90IN, respectively, according to the second selection signal SEL2<3:0> of "1000", may output the first clock bar CK00EB and the second clock bar CK90EB as the first internal clock CK00IN and the second internal clock CK90IN, respectively, according to the second selection signal SEL2<3:0> of "0100", may output the first clock CK00ED and the second clock bar CK90EB as the first internal clock CK00IN and the second internal clock CK90IN, respectively, according to the second selection signal SEL2<3:0> of "0000", and may output the first clock bar CK00EB and the second clock CK90ED as the first internal clock CK00IN and the second internal clock CK90IN, respectively, according to the second selection signal SEL2<3:0> of "1100". Furthermore, the second selector 6383 may output the first clock CK00ED and the second clock bar CK90EB as the first internal clock CK00IN and the second internal clock CK90IN, respectively, according to the second selection signal SEL2<3:0> of "1001", may output the first clock bar CK00EB and the second clock CK90ED as the first internal clock CK00IN and the second internal clock CK90IN, respectively, according to the second selection signal SEL2<3:0> of "0101", may output the first clock CK00ED and the second clock CK90ED as the first internal clock CK00IN and the second internal clock CK90IN, respectively, according to the second selection signal SEL2<3:0> of "0001", and may output the first clock bar CK00EB and the second clock bar CK90EB as the first internal clock CK00IN and the second internal clock CK90IN, respectively, according to the second selection signal SEL2<3:0> of "1101". Furthermore, the second selector 6383 may output the first clock bar CK00EB and the second clock CK90ED as the first internal clock CK00IN and the second internal clock CK90IN, respectively, according to the second selection signal SEL2<3:0> of "1010", may output the first clock CK00ED and the second clock bar CK90EB as the first internal clock CK00IN and the second internal clock CK90IN, respectively, according to the second selection signal SEL2<3:0> of "0110", may output the first clock bar CK00EB and the second clock bar CK90EB as the first internal clock CK00IN and the second internal clock CK90IN, respectively, according to the second selection signal SEL2<3:0> of "0010", and may output the first clock CK00ED and the second clock CK90ED as the first internal clock CK00IN and the second internal clock CK90IN, respectively, according to the second selection signal SEL2<3:0> of "1110". Furthermore, the second selector 6383 may output the first clock bar CK00EB and the second clock bar CK90EB as the first internal clock CK00IN and the second internal clock CK90IN, respectively, according to the second selection signal SEL2<3:0> of "1011", may output the first clock CK00ED and the second clock CK90ED as the first internal clock CK00IN and the second internal clock CK90IN, respectively, according to the second selection signal SEL2<3:0> of "0111", may output the first clock bar CK00EB and the second clock CK90ED as the first internal clock CK00IN and the second internal clock CK90IN, respectively, according to the second selection signal SEL2<3:0> of "0011", and may output the first clock CK00ED and the second clock bar CK90EB as the first internal clock CK00IN and the second internal clock CK90IN, respectively, according to the second selection signal SEL2<3:0> of "1111".

The output control unit 636 may include a first latch 636A and a second latch 636B. The first latch 636A may latch the first internal clock CK00IN according to the output activation signal SEQ_ON, and output the latched clock as the first main clock CK00. When the output activation signal SEQ_ON is activated, the first latch 636A may latch the first internal clock CK00IN and output the latched clock as the first main clock CK00. When the output activation signal SEQ_ON is deactivated, the first latch 636A may substantially maintain the logic level of the currently latched first main clock CK00. The second latch 636B may latch the second internal clock CK90IN according to the output activation signal SEQ_ON, and output the latched clock as the second main clock CK90. When the output activation signal SEQ_ON is activated, the second latch 636B may latch the second internal clock CK90IN and output the latched clock as the second main clock CK90. When the output activation signal SEQ_ON is deactivated, the second latch 636B may substantially maintain the logic level of the currently latched second main clock CK90.

Hereinafter, the operation of the semiconductor device in accordance with an embodiment of the present disclosure will be described with reference to FIG. 10 to FIG. 13.

Figure 13:
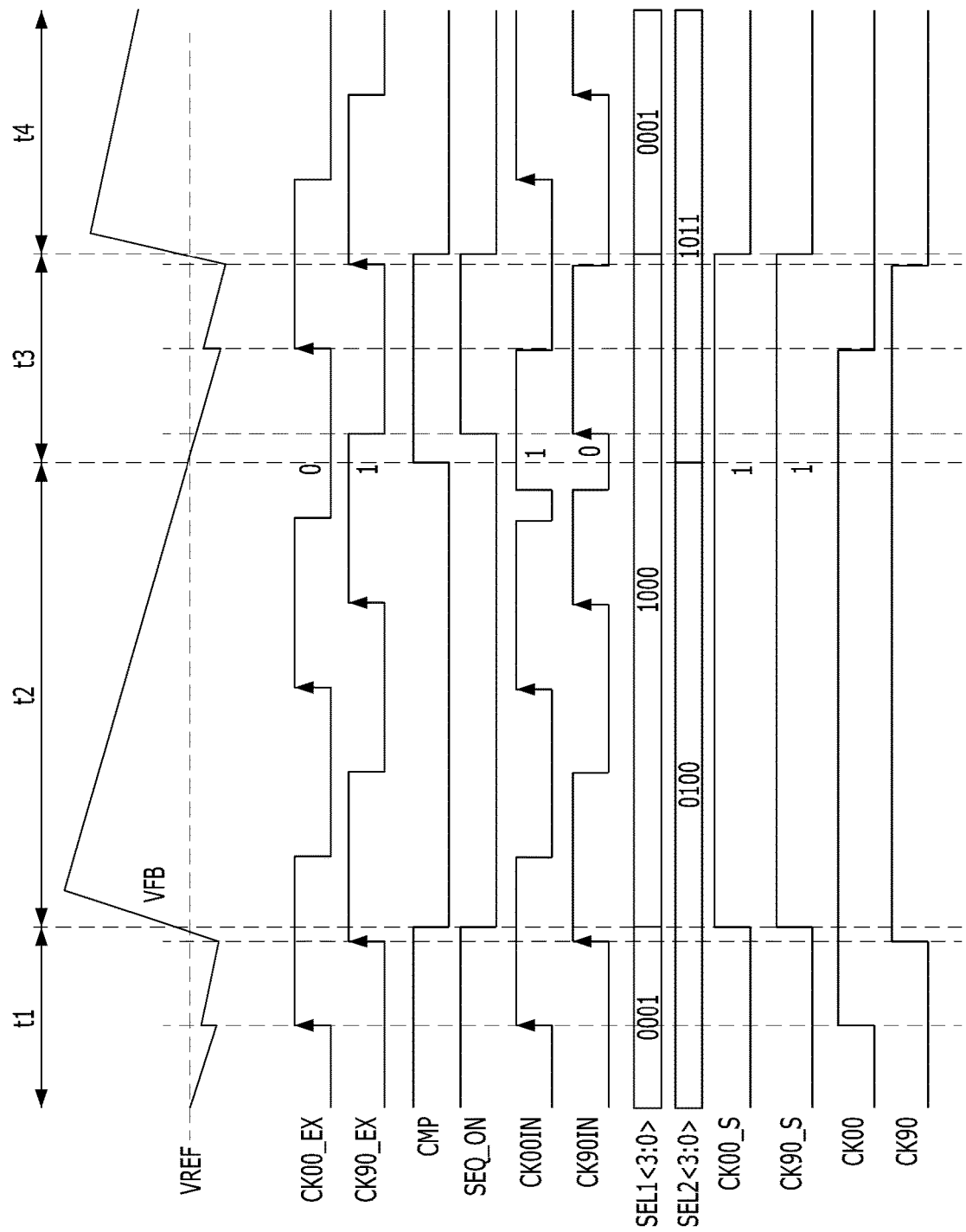
FIG. 13 is a waveform diagram for describing an operation of the semiconductor device in FIG. 10 in accordance with an embodiment of the present disclosure.

FIG. 13 is a waveform diagram for describing the operation of the semiconductor device in accordance with an embodiment of the present disclosure.

Referring to FIG. 13, in a first period t1, since the detection voltage VFB is less than or equal to the reference voltage VREF, the voltage detection circuit 120 may be in a state of outputting the comparison signal CMP at a logic high level. Since the previous clock storage unit 632 substantially maintains the first preliminary clock CK00_S and the second preliminary clock CK90_S at a logic low level, when the first selection signal SEL1<3:0> is "0001" and the second selection signal SEL2<3:0> is "0100", the clock input unit 638 may receive the first external clock CK00_EX and the second external clock CK90_EX as the first internal clock CK00IN and the second internal clock CK90IN, respectively. That is, the first external clock CK00_EX and the second external clock CK90_EX may be substantially the same as the first internal clock CK00IN and the second internal clock CK90IN, respectively. The operation of the clock order determination unit 634 when the first selection signal SEL1<3:0> is "0001" is substantially the same as that of the clock order determination unit 134 disclosed in FIG. 8. Thus, referring together to FIG. 8, the clock order determination unit 634 may invert the first internal clock CK00IN according to the first selection signal SEL1<3:0> of "0001" and output the inverted first internal clock CK00INB as the first order determination signal CK00_SEL, and may invert the second internal clock CK90IN according to the first selection signal SEL1<3:0> of "0001" and output the inverted second internal clock CK90INB as the second order determination signal CK90_SEL. The output activation signal SEQ_ON may be in an activated state according to the set signal S that is activated when both the first order determination signal CK00_SEL and the second order determination signal CK90_SEL are at a logic high level. The output control unit 636 may latch the first internal clock CK00IN and the second internal clock CK90IN according to the output activation signal SEQ_ON, and output the latched clocks as the first main clock CK00 and the second main clock CK90. Accordingly, the charge pump circuit 110 may perform a pumping operation, thereby increasing the output voltage VOUT, that is, the detection voltage VFB.

In a second period t2, the detection voltage VFB becomes greater than the reference voltage VREF. The voltage detection circuit 120 outputs the comparison signal CMP at a logic low level. The clock order determination unit 634 deactivates the output activation signal SEQ_ON and outputs the deactivated output activation signal SEQ_ON, and the output control unit 636 does not toggle the first main clock CK00 and the second main clock CK90. Accordingly, the charge pump circuit 110 performs no pumping operation. Meanwhile, the previous clock storage unit 632 stores the first main clock CK00 and the second main clock CK90 at a logic high level as the first preliminary clock CK00_S and the second preliminary clock CK90_S, respectively, at the end time point of the activation period of the comparison signal CMP. At this time, since the first preliminary clock CK00_S and the second preliminary clock CK90_S are at a logic high level, the clock order determination unit 634 may output the first internal clock CK00IN and the second internal clock CK90IN as the first order determination signal CK00_SEL and the second order determination signal CK90_SEL, respectively, according to the first selection signal SEL1<3:0> of "1000".

In a third period t3, the detection voltage VFB becomes less than or equal to the reference voltage VREF. The voltage detection circuit 120 outputs the comparison signal CMP at a logic high level. At this time, since the first preliminary clock CK00_S and the second preliminary clock CK90_S substantially maintain a logic high level, the first external clock CK00_EX is at a logic low level, and the second external clock CK90_EX is at a logic high level, the previous/current clock storage section 6381 included in the clock input unit 638 may output the second selection signal SEL2<3:0> as "1011". Accordingly, the clock selection section 6382 included in the clock input unit 638 may invert the first external clock CK00_EX and the second external clock CK90_EX to generate as the inverted first internal clock CK00INB and the inverted second internal clock CK90INB.

Since the first preliminary clock CK00_S and the second preliminary clock CK90_S substantially maintain a logic high level, the clock order determination unit 634 may output the first internal clock CK00IN as the first order determination signal CK00_SEL and output the second internal clock CK00IN as the second order determination signal CK90_SEL. That is, since the first preliminary clock CK00_S and the second preliminary clock CK90_S substantially maintain a logic high level, the clock order determination unit 634 may output the inverted first external clock CK00_EXB as the first order determination signal CK00_SEL and output the inverted second external clock CK90_EXB as the second order determination signal CK90_SEL.

Furthermore, the clock order determination unit 634 activates the set signal S when both the first order determination signal CK00_SEL and the second order determination signal CK90_SEL are at a logic high level, and thus activates the output activation signal SEQ_ON. At this time, even though the comparison signal CMP is activated, the output activation signal SEQ_ON may not be activated, and when it is determined that the transition order of the first internal clock CK00IN and the second internal clock CK90IN satisfies a specific condition, that is, when both the first order determination signal CK00_SEL and the second order determination signal CK90_SEL are at a logic high level, the output activation signal SEQ_ON may be activated.

The output control unit 636 may latch the first internal clock CK00IN and the second internal clock CK90IN according to the output activation signal SEQ_ON, and output the latched clocks as the first main clock CK00 and the second main clock CK90.

The charge pump circuit 110 may perform a pumping operation, thereby increasing the output voltage VOUT, that is, the detection voltage VFB.

In a fourth period t4, the voltage detection circuit 120 outputs the comparison signal CMP at a logic low level and the clock order determination unit 634 deactivates the output activation signal SEQ_ON. Furthermore, the previous clock storage unit 632 stores the first main clock CK00 and the second main clock CK90 at a logic low level as the first preliminary clock CK00_S and the second preliminary clock CK90_S, respectively, at the end time point of the activation period of the comparison signal CMP. The clock order determination unit 634 may invert the first internal clock CK00IN to output the inverted clock as the first order determination signal CK00_SEL and invert the second internal clock CK90IN to output the inverted clock as the second order determination signal CK90_SEL, according to the first selection signal SEL1<3:0> of "0001".

As described above, the driving control circuit 630 of the semiconductor device 100 in accordance with the present disclosure may selectively invert the first external clock CK00_EX and the second external clock CK90_EX at the start time point of the activation period of the comparison signal CMP to generate as the first internal clock CK00IN and the second internal clock CK90IN. Accordingly, when the phases of the first external clock CK00_EX and the second external clock CK90_EX are not desired phases at the start time point of the activation period of the comparison signal CMP, the driving control circuit 630 may selectively invert the first external clock CK00_EX and the second external clock CK90_EX to generate as the first internal clock CK00IN and the second internal clock CK90IN having desired phases, instead of waiting until the phases of the first external clock CK00_EX and the second external clock CK90_EX become desired phases.

Furthermore, during the activation period of the comparison signal CMP, the driving control circuit 630 may determine whether the transition order of the first internal clock CK00IN and the second internal clock CK90IN satisfies a specific condition, on the basis of the logic levels of the previously stored first preliminary clock CK00_S and second preliminary clock CK90_S, and output the first main clock CK00 and the second main clock CK90. Furthermore, the driving control circuit 630 may store the first main clock CK00 and the second main clock CK90 as the first preliminary clock CK00_S and the second preliminary clock CK90_S, respectively, at the end time point of the activation period of the comparison signal CMP, thereby controlling the logic levels of the first main clock CK00 and the second main clock CK90 to be substantially maintained. Accordingly, the semiconductor device 100 in accordance with the present disclosure may reduce current consumed by an unnecessary switching operation of the first main clock CK00 and the second main clock CK90.

Although the technical spirit of the present disclosure has been specifically described according to the above embodiments, it should be noted that the above embodiment is for description, and not for limitation. Furthermore, those who skilled in the art will understand that various embodiments can be made within the scope of the technical spirit of the present disclosure and the following claims.

For example, the position and the type of a logic gate and a transistor disclosed in the aforementioned embodiments can be differentially realized according to the polarity of an inputted signal. Furthermore, the embodiments may be combined to form additional embodiments.

What is claimed is:

1. A semiconductor device comprising:
   a charge pump circuit configured to generate an output voltage by pumping an input voltage according to first and second main clocks;
   a voltage detection circuit configured to generate a comparison signal by comparing the output voltage with a reference voltage; and
   a driving control circuit configured to:
   selectively invert first and second external clocks according to respective logic levels of the first and second preliminary clocks and the first and second external clocks at a start time of an activation period of the comparison signal to generate as first and second internal clocks,
   generate the first and second main clocks according to the first and second internal clocks during the activation period of the comparison signal while controlling a transition order so that the second main clock transitions after the first main clock transitions, and
   store logic levels of the first and second main clocks as first and second preliminary clocks, respectively, at an end time of the activation period of the comparison signal.

2. The semiconductor device of claim 1, wherein the driving control circuit comprises:
   a previous clock storage unit configured to store the first and second main clocks as the first and second preliminary clocks, respectively, according to the comparison signal;
   a clock input unit configured to selectively invert the first and second external clocks according to respective logic levels of the stored first and second preliminary clocks and the stored first and second internal clocks to generate as the first and second internal clocks;
   a clock order determination unit configured to determine whether a transition order of the first and second internal clocks satisfies a specific condition on the basis of the first and second preliminary clocks to generate an output activation signal during the activation period of the comparison signal; and
   an output control unit configured to latch the first and second internal clocks according to the output activation signal to output the first and second main clocks.

3. The semiconductor device of claim 2, wherein the previous clock storage unit comprises:
   a first storage section configured to store the first main clock as the first preliminary clock at the end time point of the activation period of the comparison signal; and
   a second storage section configured to store the second main clock as the second preliminary clock at the end time point of the activation period of the comparison signal.

4. The semiconductor device of claim 2, wherein the clock order determination unit comprises:
   a logic decoder configured to generate a first selection signal by decoding the logic levels of the first and second preliminary clocks;
   a selector configured to:
   select one of the first internal clock and the inverted first internal clock according to the first selection signal,
   output the selected one of the first internal clock and the inverted first internal clock as a first order determination signal,
   select one of the second internal clock and the inverted second internal clock according to the first selection signal, and
   output the selected one of the second internal clock and the inverted second internal clock as a second order determination signal; and
   an activation signal generation section configured to:
   activate the output activation signal according to the first and second order determination signals during the activation period of the comparison signal, and
   deactivate the output activation signal at the end time point of the activation period of the comparison signal.

5. The semiconductor device of claim 4, wherein the activation signal generation section comprises:
   a set signal generation part configured to generate a set signal according to the first and second order determination signals during the activation period of the comparison signal; and
   an SR latch configured to generate the output activation signal that is activated according to the set signal and is deactivated at the end time point of the activation period of the comparison signal.

6. The semiconductor device of claim 2, wherein the clock input unit comprises:
   a clock selection section configured to:
   selectively invert the first and second external clocks in response to a second selection signal to generate as the first and second internal clocks; and
   a previous/current clock storage section configured to store, as the second selection signal, the respective logic levels of the first and second internal clocks and the first and second preliminary clocks at the start time point of the activation period of the comparison signal.

7. The semiconductor device of claim 6, wherein the previous/current clock storage section comprises:
   a third storage part configured to store, as a first bit of the second selection signal, the first preliminary clock and output the first bit of the second selection signal at the start time point of the activation period of the comparison signal,
   a fourth storage part configured to store, as a second bit of the second selection signal, the second preliminary clock and output the second bit of the second selection signal at the start time point of the activation period of the comparison signal,
   a fifth storage part configured to store, as a third bit of the second selection signal, the first internal clock and output the third bit of the second selection signal at the start time point of the activation period of the comparison signal, and
   a sixth storage part configured to store, as a fourth bit of the second selection signal, the second internal clock and output the fourth bit of the second selection signal at the start time point of the activation period of the comparison signal.

8. The semiconductor device of claim 6,
   wherein the clock selection section selects one of the first external clock and the inverted first external clock according to the second selection signal, as the first internal clock, and
   selects one of the second external clock and the inverted second external clock according to the second selection signal, as the second internal clock.

9. The semiconductor device of claim 2, wherein the output control unit comprises:
   a first latch configured to latch the first internal clock according to the output activation signal to output the latched clock as the first main clock; and a second latch configured to latch the second internal clock according to the output activation signal to output the latched clock as the second main clock.

10. The semiconductor device of claim 1, wherein the charge pump circuit includes at least two pump stages and generates the output voltage by:
   driving an odd-numbered pump stage according to the first main clock and a first sub-clock which is an inverted signal of the first main clock, and
   driving an even-numbered pump stage according to the second main clock and a second sub-clock which is an inverted signal of the second main clock.

11. The semiconductor device of claim 1, wherein the first main clock and the second main clock have a phase difference of 90° therebetween.

12. A method of operating a semiconductor device, the method comprising:
   generating an output voltage by pumping an input voltage according to first and second main clocks;
   generating a comparison signal by comparing the output voltage with a reference voltage;
   selectively inverting, at a start time of an activation period of the comparison signal, first and second external clocks to generate as first and second internal clocks;
   generating, during an activation period of the comparison signal, an output activation signal by determining whether the second internal clock transitions after the first internal clock transitions on the basis of logic levels of first and second preliminary clocks;
   outputting the first and second main clocks by latching the first and second internal clocks according to the output activation signal; and
   storing, at an end time point of the activation period of the comparison signal, the first and second main clocks as the first and second preliminary clocks, respectively.

13. The method of claim 12, wherein the first and second external clocks are selectively inverted according to respective logic levels of the first and second preliminary clocks and the first and second external clocks to generate as the first and second internal clocks.

14. The method of claim 13, wherein the generating of the output activation signal by the determining comprises:
   generating a first selection signal by decoding the logic levels of the first and second preliminary clocks;
   selecting one of the first internal clock and an inverted first internal clock according to the first selection signal;
   outputting the selected one of the first internal clock and the inverted first internal clock as a first order determination signal;
   selecting one of the second internal clock and an inverted second internal clock according to the first selection signal;
   outputting the selected one of the second internal clock and the inverted second internal clock as a second order determination signal; and
   generating the output activation signal according to the first and second order determination signals during the activation period of the comparison signal.

15. The method of claim 14, wherein the generating of the output activation signal according to the first and second order determination signals comprises:
   generating a set signal according to the first and second order determination signals during the activation period of the comparison signal;
   activating the output activation signal according to the set signal; and
   deactivating the output activation signal at the end time point of the activation period of the comparison signal.

16. The method of claim 13, wherein the selectively inverting comprises:
   selectively inverting the first and second external clocks in response to a second selection signal to generate as the first and second internal clocks; and
   storing, as the second selection signal, respective logic levels of the first and second internal clocks and the first and second preliminary clocks at the start time point of the activation period of the comparison signal.

17. The method of claim 16, wherein the selectively inverting the first and second external clocks in response to the second selection signal includes:
   selecting one of the first external clock and the inverted first external clock according to the second selection signal, as the first internal clock; and
   selecting one of the second external clock and the inverted second external clock according to the second selection signal, as the second internal clock.

18. The method of claim 12, wherein the generating of the output voltage comprises:
   driving an odd-numbered pump stage according to the first main clock and a first sub-clock that is an inverted signal of the first main clock; and
   driving an even-numbered pump stage according to the second main clock and a second sub-clock that is an inverted signal of the second main clock.

19. The method of claim 12, wherein the first main clock and the second main clock have a phase difference of 90° therebetween.

* * * * *